(12) United States Patent
Watanabe et al.

(10) Patent No.: US 12,396,300 B1
(45) Date of Patent: Aug. 19, 2025

(54) LIGHT-EMITTING DEVICE AND METHOD OF MANUFACTURING THE SAME

(71) Applicants: Citizen Electronics Co., Ltd., Fujiyoshida (JP); Citizen Watch Co., Ltd., Nishitokyo (JP)

(72) Inventors: Kiyokazu Watanabe, Fujiyoshida (JP); Katsuya Aoshima, Fujiyoshida (JP)

(73) Assignees: Citizen Electronics Co., Ltd., Fujiyoshida (JP); Citizen Watch Co., Ltd., Nishitokyo (JP)

( * ) Notice: Subject to any disclaimer, the term of this patent is extended or adjusted under 35 U.S.C. 154(b) by 0 days.

(21) Appl. No.: 18/874,035

(22) PCT Filed: Dec. 12, 2023

(86) PCT No.: PCT/JP2023/044390
§ 371 (c)(1),
(2) Date: Mar. 27, 2025

(87) PCT Pub. No.: WO2024/150582
PCT Pub. Date: Jul. 18, 2024

(30) Foreign Application Priority Data

Jan. 11, 2023 (JP) .................................. 2023-002592

(51) Int. Cl.
*H10H 20/854* (2025.01)
*H10H 20/01* (2025.01)
(Continued)

(52) U.S. Cl.
CPC ...... *H10H 20/854* (2025.01); *H10H 20/0361* (2025.01); *H10H 20/0362* (2025.01); *H10H 20/8512* (2025.01); *H10H 20/857* (2025.01)

(58) Field of Classification Search
CPC ........... H10H 20/0361; H10H 20/8512; H10H 20/857; H10H 20/854; H10H 20/0362
See application file for complete search history.

(56) References Cited

U.S. PATENT DOCUMENTS

2013/0011617 A1\* 1/2013 Tasaki .................... H10F 19/80
174/250
2014/0203305 A1 7/2014 Kawano et al.
(Continued)

FOREIGN PATENT DOCUMENTS

EP 2692759 A1 2/2014
EP 3889238 A1 10/2021
(Continued)

OTHER PUBLICATIONS

International Search Report and Written Opinion received in corresponding International Application No. PCT/JP2023/044390, mailed Jan. 16, 2024, in 16 pages, with translation.
(Continued)

*Primary Examiner* — Antonio B Crite
(74) *Attorney, Agent, or Firm* — Procopio, Cory, Hargreaves & Savitch LLP

(57) ABSTRACT

A light-emitting device includes a dam member disposed around an LED element. The dam member includes a base resin, a first-particle-size filler, and a second-particle-size filler. The dam member contains 10 to 50 wt % of the first-particle-size filler with respect to the base resin. The first-particle-size filler has an average particle size of 1 to 100 μm. The dam member contains 4 to 15 wt % of the second-particle-size filler with respect to the base resin. The second-particle-size filler has an average particle size of 1 to 500 nm. The dam member has a side surface made by dicing.

18 Claims, 17 Drawing Sheets

(51) Int. Cl.
    *H10H 20/851*    (2025.01)
    *H10H 20/857*    (2025.01)

(56) References Cited

U.S. PATENT DOCUMENTS

| | | |
|---|---|---|
| 2014/0291716 A1 | 10/2014 | Ukawa |
| 2015/0049481 A1 | 2/2015 | Oyamada et al. |
| 2016/0133610 A1 | 5/2016 | Reiherzer et al. |
| 2018/0309035 A1 | 10/2018 | Bando et al. |

FOREIGN PATENT DOCUMENTS

| | | |
|---|---|---|
| JP | 2009-135485 A | 6/2009 |
| JP | 2011-060961 A | 3/2011 |
| JP | 2014-138185 A | 7/2014 |
| JP | 2014-187081 A | 10/2014 |
| JP | 2014-209602 A | 11/2014 |
| JP | 2015-037170 A | 2/2015 |
| JP | 2017-017176 A | 1/2017 |
| JP | 2018-186264 A | 11/2018 |
| JP | 2020-120118 A | 8/2020 |
| JP | 2020-136528 A | 8/2020 |
| JP | 2021-170631 A | 10/2021 |
| WO | 2012/133587 A1 | 10/2012 |

OTHER PUBLICATIONS

Office Action received in corresponding JP Application No. 2023-148722, dated Jun. 18, 2024, in 4 pages, with translation.

\* cited by examiner

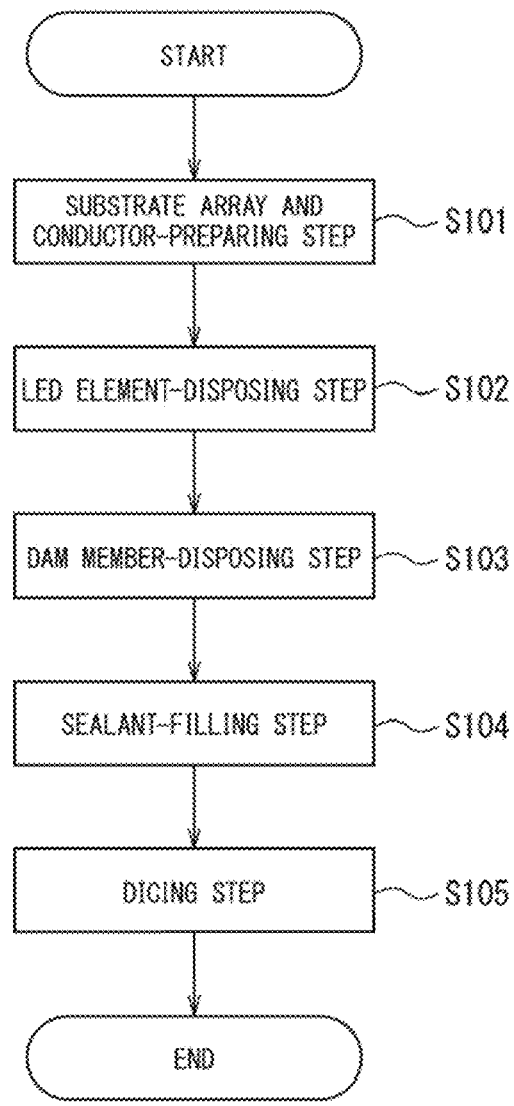

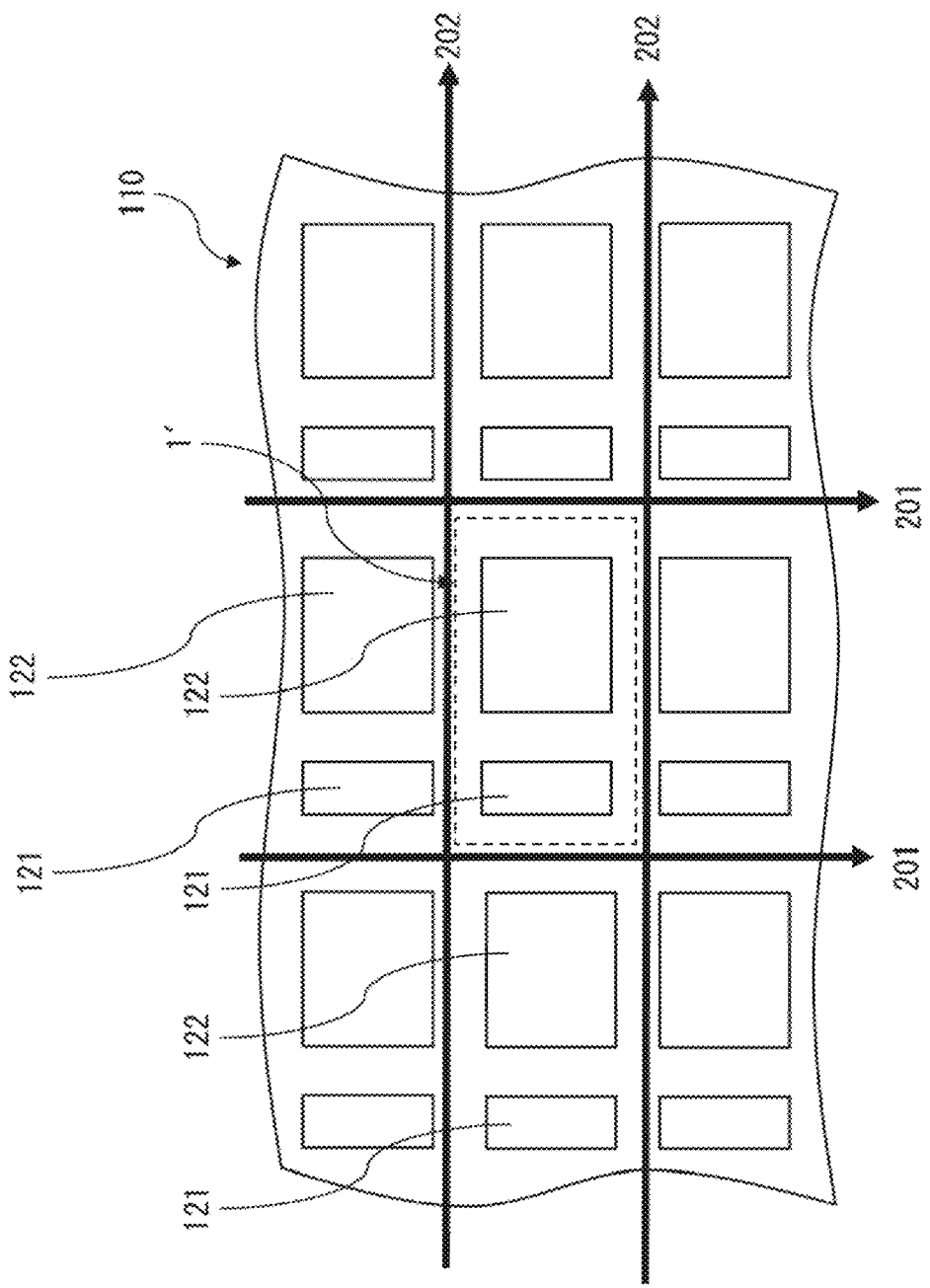

LIGHT-EMITTING DEVICE AND METHOD OF MANUFACTURING THE SAME

CROSS-REFERENCE TO RELATED APPLICATIONS

This application is a U.S. National Stage entry of PCT Application No. PCT/JP2023-044390, filed Dec. 12, 2023, which claims priority to Japanese Patent Application No. 2023-002592, filed Jan. 11, 2023, the contents of which are incorporated herein by reference.

FIELD

The present disclosure relates to a light-emitting device and a method of manufacturing the same.

BACKGROUND

It is preferable that a dam member of a light-emitting device have some degree of viscosity from the viewpoint of preventing loss of its shape retaining property, and it is known that for this purpose, inorganic particles are utilized to provide thixotropy (e.g., see Japanese Unexamined Patent Publication JP2009-135485A).

SUMMARY

Unfortunately, JP2009-135485A does not describe an additive of a dam member that makes both the shape retaining property and the dicing property of a dam member excellent.

An object of the present disclosure is to provide a light-emitting device that excels in both the shape retaining property and the dicing property of a dam member by adding two kinds of inorganic particles.

A light-emitting device according to the present disclosure includes a substrate, an LED element mounted on the substrate, a dam member disposed around the LED element, and a sealant disposed inside the dam member and sealing the LED element. The dam member includes a base resin, a first-particle-size filler, and a second-particle-size filler. The dam member contains 10 to 50 wt % of the first-particle-size filler with respect to the base resin. The first-particle-size filler has an average particle size of 1 to 100 µm. The dam member contains 4 to 15 wt % of the second-particle-size filler with respect to the base resin. The second-particle-size filler has an average particle size of 1 to 500 nm. The dam member has a side surface made by dicing.

In the light-emitting device according to the present disclosure, the ratio of bottom width to height of the dam member is preferably 0.6 to 4.0.

In the light-emitting device according to the present disclosure, a surface of the dam member facing the LED element is preferably a convexity curved out toward the LED element.

In the light-emitting device according to the present disclosure, the dam member preferably has a Shore D hardness of 65 to 74.

In the light-emitting device according to the present disclosure, the dam member preferably further includes titanium oxide, and contains 10 to 70 wt % of the titanium oxide with respect to the base resin.

In the light-emitting device according to the present disclosure, preferably, the dam member further includes a first frame part and a second frame part disposed on the upper surface of the first frame part, and the first frame part has the same ratio between bottom width and height as the second frame part.

The light-emitting device according to the present disclosure preferably further includes a wire for supplying electric power to the LED element. Part of the wire is preferably covered with the dam member.

In the light-emitting device according to the present disclosure, the dam member is preferably optically transparent.

In the light-emitting device according to the present disclosure, preferably, the substrate has a rectangular shape with two pairs of sides; and the dam member includes a pair of first frame parts disposed along one of the two pairs of sides, a pair of second frame parts disposed on the upper surfaces of the pair of first frame parts, and a pair of third frame parts disposed along the other of the two pairs of sides.

In the light-emitting device according to the present disclosure, preferably, the substrate has a rectangular shape with a pair of long sides and a pair of short sides shorter than the pair of long sides, the pair of first frame parts and the pair of second frame parts are disposed along the pair of long sides, and the pair of third frame parts is disposed along the pair of short sides.

In the light-emitting device according to the present disclosure, preferably, both ends of the pair of third frame parts are disposed on the upper surfaces of both ends of the pair of first frame parts, and both ends of the pair of second frame parts are disposed on the upper surfaces of both ends of the pair of third frame parts.

The light-emitting device according to the present disclosure preferably further includes a conductive pattern that has electrical conductivity and that is disposed on the upper surface of the substrate so as to be surrounded by the dam member. The LED element is preferably disposed on the upper surface of the conductive pattern, and the dam member covers an outer edge of the conductive pattern.

In the light-emitting device according to the present disclosure, the dam member preferably further includes a phosphor disposed on the upper surface of the substrate and converting the wavelength of light emitted from the LED element 14.

In the light-emitting device according to the present disclosure, the dam member preferably further includes a first frame part disposed on the substrate and including the phosphor, and a second frame part disposed on the upper surface of the first frame part and including the first-particle-size filler and the second-particle-size filler.

The light-emitting device according to the present disclosure preferably further includes a phosphor layer that is disposed between the dam member and the substrate on the upper surface of the substrate, and that contains a phosphor converting the wavelength of light emitted from the LED element.

In the light-emitting device according to the present disclosure, preferably, the substrate has a recess having a bottom surface and a side surface disposed so as to surround the bottom surface, and the LED element is disposed on the bottom surface of the recess, and the dam member is disposed so as to surround the recess.

A method of manufacturing a light-emitting device according to the present disclosure includes the steps of mounting an LED element on a surface of a substrate array, disposing a dam member around the LED element with a dispenser, disposing a sealant sealing the LED element inside the dam member, and dicing a cured dam member.

The dam member includes a base resin, a first-particle-size filler, and a second-particle-size filler. The dam member contains 10 to 50 wt % of the first-particle-size filler with respect to the base resin. The first-particle-size filler has an average particle size of 1 to 100 μm. The dam member contains 4 to 15 wt % of the second-particle-size filler with respect to the base resin. The second-particle-size filler has an average particle size of 1 to 500 nm.

In the step of cutting the dam member of the method of manufacturing a light-emitting device according to the present disclosure, the substrate array is preferably diced from a surface on which the LED element is not mounted.

The light-emitting device further includes a wire for supplying electric power to the LED element, and in the step of forming a dam member of the method of manufacturing a light-emitting device according to the present disclosure, a dam member is preferably formed so as to cover part of the wire.

According to the light-emitting device and the manufacturing method of the present disclosure, a light-emitting device that excels in both the shape retaining property and the dicing property of a dam member can be provided by adding two kinds of inorganic particles.

BRIEF DESCRIPTION OF DRAWINGS

FIG. 4 is a flowchart showing an example of flow of a method of manufacturing the light-emitting device 1;

FIG. 6 shows an example of a substrate array used for a method of manufacturing a light-emitting device 1';

DESCRIPTION OF EMBODIMENTS

Figure 1:
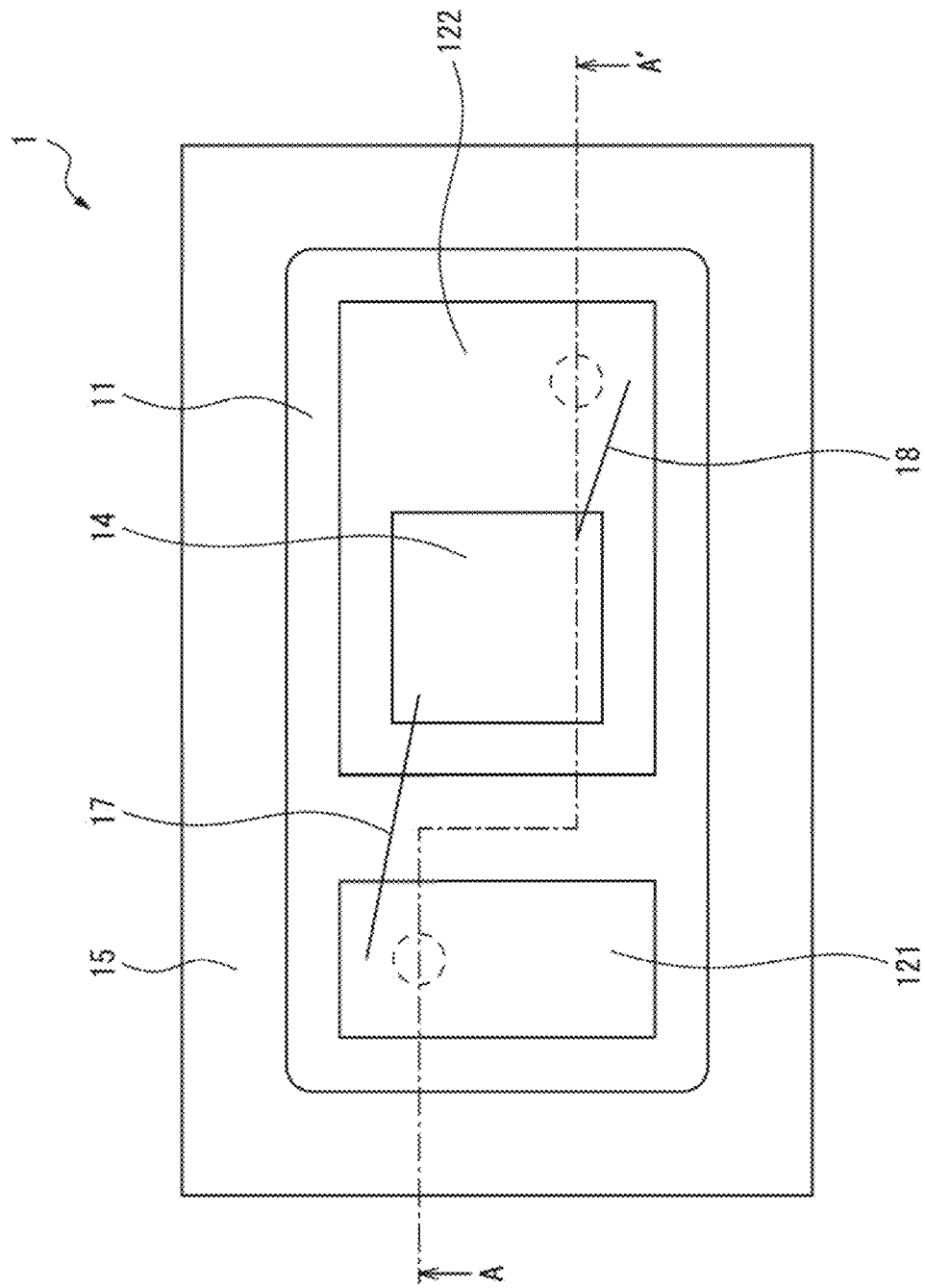
FIG. 1 is a plan view of a light-emitting device 1 according to a first embodiment.

Embodiments of the invention will now be described with reference to the attached drawings as necessary. However, note that the technical scope of the present invention is not limited to embodiments thereof and covers the invention described in the claims and equivalents thereof. The sizes, the numbers of repetitions, and the positional relationships of members shown in the drawings may be exaggerated or omitted in some cases for ease of description.

Figure 2:
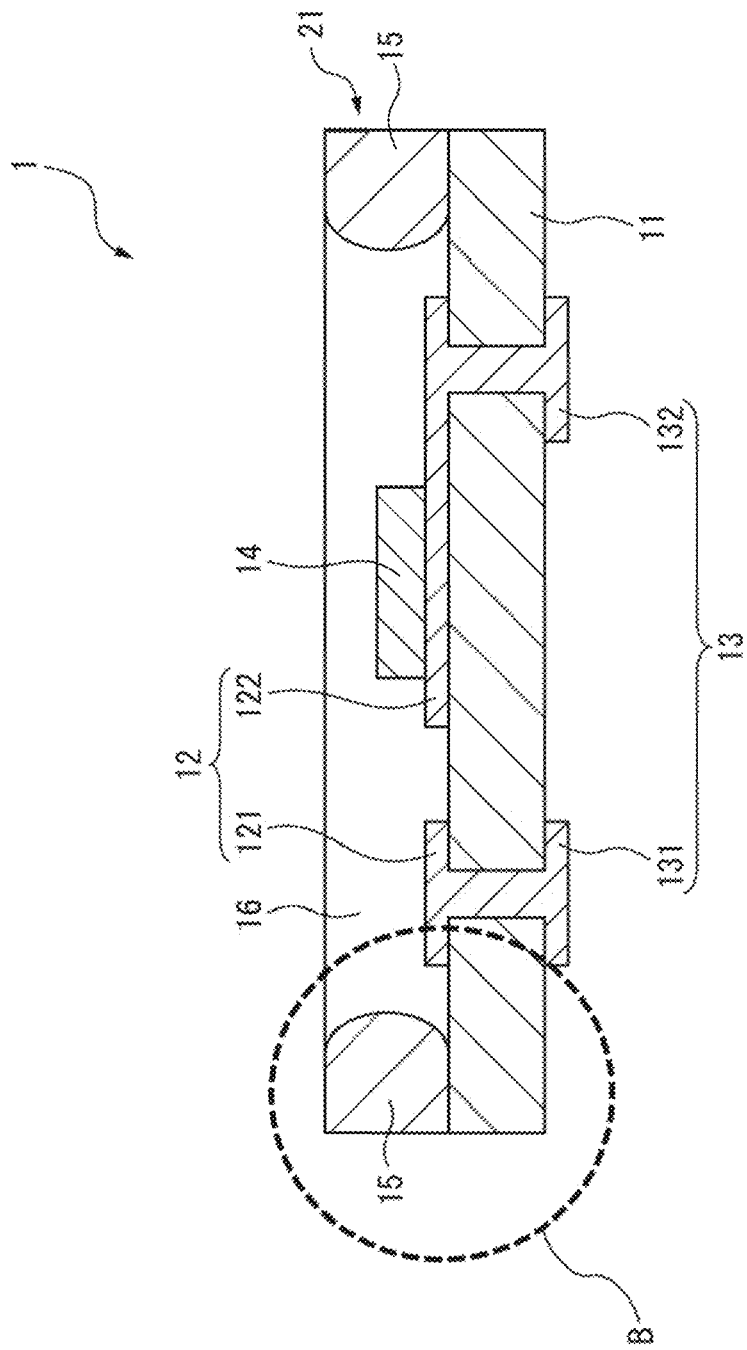
FIG. 2 shows a cross section taken along line A-A' in FIG. 1.
Figure 3:
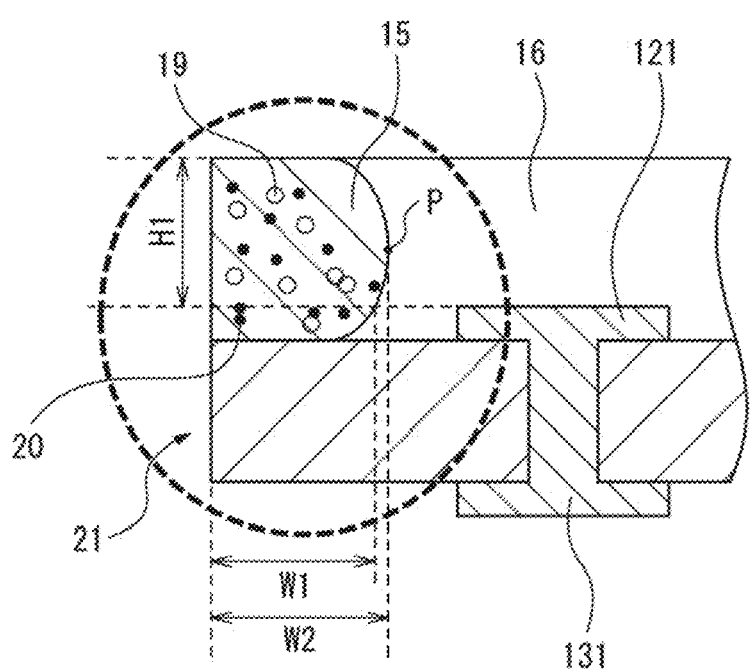
FIG. 3 is an enlarged view of B-portion in FIG. 2.

FIG. 1 is a plan view of a light-emitting device 1 according to a first embodiment. FIG. 2 shows a cross section taken along line A-A' in FIG. 1. FIG. 3 is an enlarged view of B-portion in FIG. 2.

The light-emitting device 1 includes a substrate 11, a conductive pattern 12, electrodes 13, a single LED element 14, a dam member 15, a sealant 16, and bonding wires 17 and 18.

The substrate 11 is formed of an electrically insulating resin, such as phenolic resin, epoxy resin, polyimide resin, or polyester resin, into a rectangular plate-like shape having a pair of long sides 111 and 112 as well as a pair of short sides 113 and 114 shorter than the pair of long sides 111 and 112. The thickness of the substrate 11 is, for example, 200 μm. The substrate 11 may be formed of a ceramic material, such as alumina or aluminum nitride.

The conductive pattern 12 includes a first conductor 121 and a second conductor 122 that have a plate-like shape and that are disposed separately on the upper surface of the substrate 11 so as to be surrounded by the dam member 15. The first conductor 121 and the second conductor 122 have a rectangular shape and are formed of silver. The first conductor 121 and the second conductor 122 have enough areas to dispose the bonding wires 17 and 18 that can provide electrical connection to the LED element 14. The distance between the first conductor 121 and the second conductor 122 is at least a distance that keeps sufficient insulation. The first conductor 121 and the second conductor 122 have enough areas to dispose the bonding wires and are separated at least the insulation distance, which results in the substrate 11 having a rectangular shape in which the first conductor 121 and the second conductor 122 are arranged in the longitudinal direction. In the example shown in FIG. 1, the first conductor 121 and the second conductor 122 are arranged in the longitudinal direction of the substrate 11. The thickness of the first conductor 121 and the second conductor 122 is, for example, 50 μm. The conductive pattern 12 may be formed of another electrically conductive material that includes gold, copper, or aluminum and that reflects light from the LED element 14.

The electrodes 13 include a first electrode 131 and a second electrode 132 that are separately provided on the lower surface of the substrate 11. The first electrode 131 and the second electrode 132 are formed of an electric conductor, such as gold or copper. The first electrode 131 is electrically connected to the first conductor 121 via a through-hole (indicated by a dashed line in FIG. 1) that penetrates the substrate 11 vertically. Similarly, the second electrode 132 is electrically connected to the second conductor 122 via a through-hole (indicated by a dashed line in FIG. 1) that penetrates the substrate 11 vertically. The first electrode 131 and the second electrode 132 are connected to an external power source (not shown) and used for supplying electric power to the LED element 14 via the conductive pattern 12.

The LED element 14 is fixed and disposed on the upper surface of the second conductor 122 by die bonding (not shown) with a binder, such as resin paste, silver paste, or solder. The LED element 14 is, for example, a blue LED formed of an InGaN-based compound semiconductor that emits light of a wavelength of 440 to 455 nm. On its upper surface 141, the LED element 14 has a pair of element electrodes: a first element electrode connected to the first conductor 121 via the bonding wire 17, and a second element electrode connected to the second conductor 122 via the bonding wire 18. The binder may be slightly squeezed outside the LED element 14 in some cases.

The LED element 14 has a substantially rectangular parallelepiped shape, for example, 650 μm in length and breadth, and 260 μm in height. The LED element 14 emits light in response to a current being supplied between the first conductor 121 and the second conductor 122 from an external power source. The LED element 14 is not limited to a blue LED, and may be, for example, a violet LED, a near-ultraviolet LED, or an infrared LED. The wavelength range of the emitted light may be a range approximately from 200 to 440 nm, which includes the ultraviolet region, or a range approximately from 780 to 5000 nm, which includes the infrared region.

The dam member 15 is disposed rectangularly on the upper surface of the substrate 11 along the outer edges of the substrate 11 so as to surround the LED element 14, the first conductor 121, and the second conductor 122. The dam member 15 is a white resin formed by dispersing fine particles of titanium oxide ($TiO_2$) in a base resin, such as silicon resin or epoxy resin, and has the function of reflecting light from the LED element 14. As shown in FIG. 3, the dam member 15 further includes a first-particle-size filler 19 and a second-particle-size filler 20. The left and right side surfaces of the dam member 15 are side surfaces 21 made by dicing, as will be described below. The dam member 15 need not necessarily include fine particles of titanium oxide ($TiO_2$).

The surfaces of the first conductor 121 and the second conductor 122 may be roughened by being irradiated, for example, with plasma. Roughening the surfaces of the first conductor 121 and the second conductor 122 inhibits unintentional creep and spread of the dam member 15 on the surfaces of the first conductor 121 and the second conductor 122.

The first-particle-size filler 19 is composed of inorganic particles of silicon dioxide, iron oxide, aluminum oxide, or the like, and has an average particle size of 1 to 100 μm. The cured dam member 15 of the finished light-emitting device 1 contains 10 to 50 wt % of the first-particle-size filler 19 with respect to the base resin. Containing the first-particle-size filler 19 in the dam member increases the hardness of the cured dam member 15. When the dam member contains less than 10 wt % of the first-particle-size filler 19, the dam member has insufficient hardness, which results in burrs being made at cutting, e.g., dicing, making it difficult to keep the outward appearance of the product favorable. When the dam member contains more than 50 wt % of the first-particle-size filler 19, it is difficult to keep the dam member having a predetermined shape because of the bearing effect of the particles. Thus the cured dam member 15 of the finished light-emitting device 1 contains 10 to 50 wt % of the first-particle-size filler 19 with respect to the base resin so as to have favorable side surfaces made by dicing. Details will be described below.

The second-particle-size filler 20 is composed of inorganic particles of silica, silicon dioxide, iron oxide, aluminum oxide, or the like, and has an average particle size of 1 to 500 nm. The cured dam member 15 of the finished light-emitting device 1 contains 4 to 15 wt % of the second-particle-size filler 20 with respect to the base resin. Containing the second-particle-size filler 20 in the dam member 15 results in viscosity during manufacture being high, enables keeping space between the particles at high viscosity, and enables keeping a tall and narrow shape. When the dam member contains less than 4 wt % of the second-particle-size filler 20, the dam member has insufficient viscosity before being cured, making it difficult to keep a desired shape. When the dam member contains more than 15 wt % of the second-particle-size filler 20, the viscosity is so high that a nozzle for application will be clogged, making it difficult to apply a resin for forming the dam member. Thus the cured dam member 15 of the finished light-emitting device 1 contains 4 to 15 wt % of the second-particle-size filler 20 with respect to the base resin so that a dam member of a desired shape can be formed. Details will be described below. The second-particle-size filler 20 preferably has a specific surface of 50 to 500 $m^2/g$.

The above average particle sizes of the first-particle-size filler 19 and the second-particle-size filler 20 are measured by the following method. Regarding the first-particle-size filler 19, the dam member 15 is cut first, and the cross section is observed with an electron microscope. Then, in an area of 500 $\mu m^2$, fifty particles of the first-particle-size filler are identified, and the average of the major axes of the first-particle-size filler is determined as the average particle size. Regarding the second-particle-size filler 20, similarly, the dam member 15 is cut first, and the cross section is observed with an electron microscope. Then, in an area of 500 $\mu m^2$, fifty particles of the second-particle-size filler are identified, and the average of the major axes of the second-particle-size filler is determined as the average particle size.

The sealant 16 is a translucent resin, such as epoxy resin or silicon resin. The sealant 16 is filled in the region surrounded by the dam member 15 to a height that at least the upper surface 141 of the LED element 14 is not exposed, thereby sealing the LED element 14. In the sealant 16 is mixed a phosphor converting the wavelength of light from the LED element 14. As such a phosphor, a yellow phosphor such as yttrium aluminum garnet (YAG) is mixed in the sealant 16. The light-emitting device 1 emits white light by mixing blue light from the blue LED element 14 with yellow light obtained by the blue light exciting the yellow phosphor. FIGS. 1 to 3 show the sealant 16 as if it were transparent, and the same applies to the subsequent figures.

The above-mentioned yellow phosphor is merely an example, and the sealant 16 may contain another phosphor. The sealant 16 may contain two kinds of phosphors, e.g., a green phosphor and a red phosphor. In this case, the light-emitting device 1 emits white light by mixing blue light from the blue LED element 14 with green light and red light obtained by the blue light exciting the green and red phosphors. As the green phosphor can be used a particulate phosphor material that absorbs blue light emitted from the LED element 14 to wavelength-convert it into green light, such as $(BaSr)_2SiO_4:Eu^{2+}$. As the red phosphor can be used a particulate phosphor material that absorbs blue light emitted from the LED element 14 to wavelength-convert it into red light, such as $CaAlSiN_3:Eu2^{2+}$. Alternatively, the red phosphor may be KSF.

The above-mentioned green and red phosphors are merely an example, and the sealant 16 may contain the above-mentioned yellow phosphor and small amounts of green and red phosphors. In this case, the light-emitting device 1 basically emits white light by mixing blue light from the blue LED element 14 with yellow light obtained by the blue light exciting the yellow phosphor, also mixes green light and red light obtained by excitation with the white light, and thereby can emit white light with high color rendering properties, although these properties are not as good as those in the case of the above-mentioned combination.

The sealant 16 may contain a filler. A filler can scatter light and thus provides a less directional light-emitting property. Containing no filler or a small amount of filler results in a highly directional light-emitting property, and the light-emitting element emits intense light directly upward, which is preferable. The phosphor may be settled on the substrate surface, which facilitates adjustment to chromaticity. In addition, the sealant 16 may have a two-layer structure including a lower layer of the settled phosphor and an upper filler layer where the phosphor content is low. The two-layer structure makes the sealant 16 with the phosphor to look light in color.

FIG. 4 is a flowchart showing an example of flow of a method of manufacturing the light-emitting device 1. FIGS. 5(A) to 5(E) are schematic diagrams for explaining the steps of the method of manufacturing the light-emitting device 1. In FIGS. 4 and 5, it is assumed that multiple light-emitting devices 1 are simultaneously manufactured, but light-emitting devices 1 may be manufactured one by one.

Figure 5A:
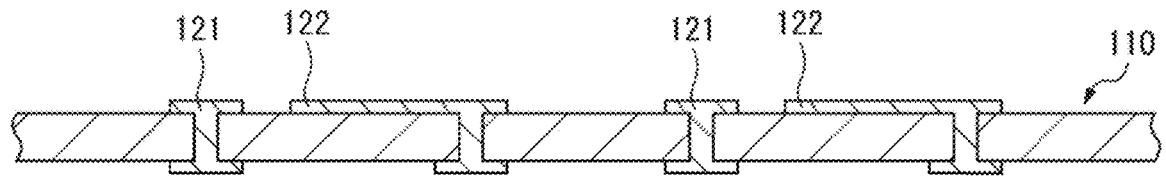
FIGS. 5(A) to (E) are schematic diagrams for explaining the steps of the method of manufacturing the light-emitting device 1.

First, in a substrate array and conductor-preparing step, a substrate array 110 is prepared on which multiple conductive patterns 12 and electrodes 13 are disposed in advance, as shown in FIG. 5(A) (step S101). The conductive pattern 12 and the electrodes 13 are disposed at predetermined positions on the upper and lower surfaces of each substrate 11a, for example, by electroless silver plating, and electrically connected to each other. A substrate array refers to multiple substrates 11 combined together before being cut.

Figure 5B:
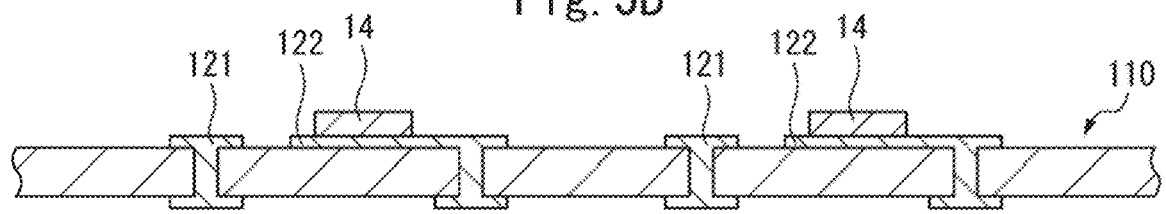

Next, in an LED element-disposing step, an LED element 14 is mounted on the upper surface of each second conductor 122 of the substrate array 110, for example, by die bonding, as shown in FIG. 5(B) (step S102). In the LED element-disposing step, a bonding wire 17 is disposed to connect a first element electrode of the LED element 14 to the first conductor 121, and a bonding wire 18 is disposed to connect a second element electrode of the LED element 14 to the second conductor 122. Since the LED elements 14 are mounted on the conductive patterns 12 before dam members 15 are disposed, the light-emitting device 1 can be downsized and the LED elements 14 can be easily mounted at short intervals.

Figure 5C:
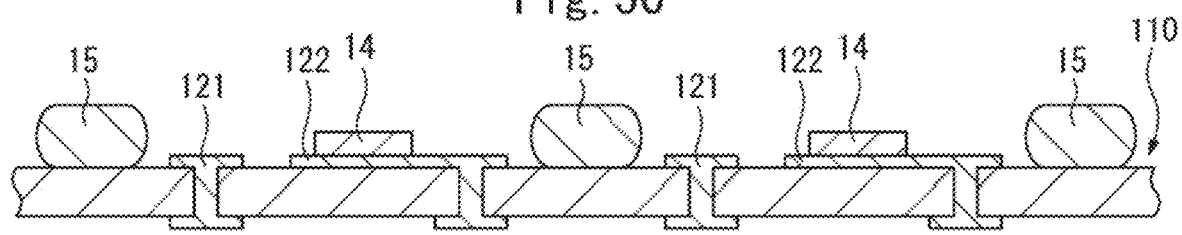

Next, in a dam member-disposing step, the dam members 15 are disposed on the upper surface of the substrate array 110 so as to surround the respective conductive patterns 12 and LED elements 14, as shown in FIG. 5(C) (step S103). First, white resin drops are prepared by dispersing fine particles of titanium oxide, a first-particle-size filler 19, and a second-particle-size filler 20 in a thermosetting base resin, such as silicon resin. Next, the white resin drops are applied, from a nozzle (not shown), to the substrate array 110 so as to surround each conductive pattern 12 and LED element 14. Next, the applied resin drops are heated and cured to form dam members 15. The dam member 15, which is soft before being uncured, can cover the bonding wire 17 or 18 and be disposed close to the LED element 14 even if the bonding wire 17 or 18 exists. The dam member 15 is preferably taller than the LED element 14. Such a configuration enables the light-emitting device 1 to be highly directional.

By heating, the base resin of the dam member 15 is volatilized and becomes 0 to 10% lighter than the uncured base resin. At this time, the inner circumferential surface of the dam member 15 becomes a curved surface by surface tension of the resin drops (see FIG. 3). While the dam members 15 are being cured or after they are cured, the upper surfaces of the dam members 15 may be pressed and thereby made even. Further, a depression can be made in the pressed surface with a pressing jig having a convex shape. This depression can be used as a polarity mark. After curing and before dicing, the aspect ratio of bottom width to height of the dam member 15 is preferably in the range of 0.6 to 1.1, and is 0.83 in an example.

Figure 5D:
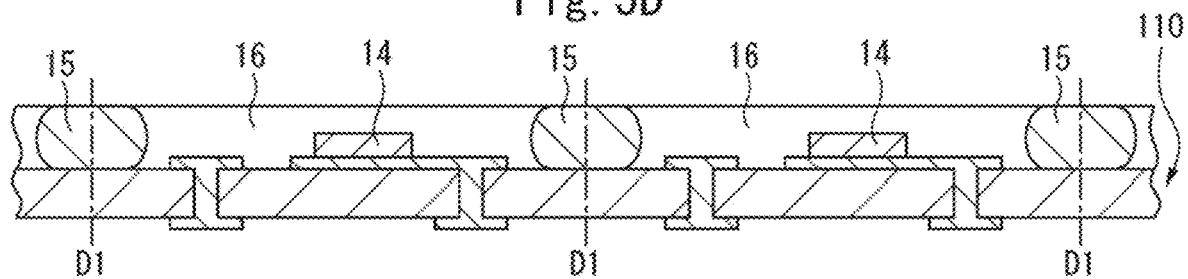

Next, in a sealant-filling step, a sealant 16 is disposed in each of the regions surrounded by the respective dam members 15 to a height that the upper surface 141 of the LED element 14 is not exposed, as shown in FIG. 5(D) (step S104). The disposed (or filled) sealant 16 is heated and cured.

Figure 5E:
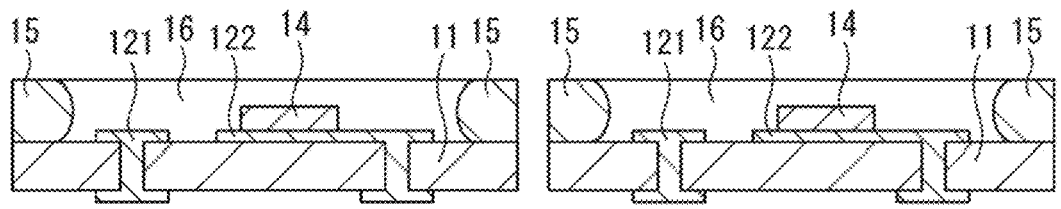

Finally, in a dicing step, the substrate array 110 are cut near the centers of the respective dam members 15 (at positions of D1) into pieces, as shown in FIG. 5(E), and thereby light-emitting devices 1 are manufactured (step S105). This results in the outer side surfaces of each dam member 15 being side surfaces 21 made by dicing. After dicing, the aspect ratio of bottom width to height of the dam member 15 is preferably in the range of 1.0 to 2.4, more preferably in the range of 1.6 to 2.0, and is 1.94 in an example.

In the dicing step, the substrate array 110 is preferably diced from the surface on which the LED elements 14 are not mounted. As will be described below, when the dam member 15 has a Shore D hardness of 65 to 74, the substrate array 110 can be diced from the back surface without crushing the sealant 16. Burrs of the substrate 11 can be reduced by dicing the substrate array 110 from the surface on which the LED elements 14 are not mounted. Burrs of the substrate 11 cause the light-emitting device 1 to incline when the device is mounted on a heat sink, which will reduce dissipated heat and result in a decrease in luminous efficiency. By the dam member 15 having a Shore D hardness, which is higher than the hardness of an ordinary dam member, peeling of the resin is prevented even if the substrate array 110 is diced from the surface on which the LED elements 14 are not mounted.

FIG. 6 is a plan view showing an example of a substrate array 110 for manufacturing a light-emitting device 1', which is a modified example of the light-emitting device 1. The light-emitting device 1' differs from the light-emitting device 1 only in the width of a dam member 15'. The other components, which are the same as those of the light-emitting device 1, are assigned the same reference numerals, and description thereof is omitted. In addition, the material constituting the dam member 15' and the other features are the same as those of the dam member 15. The substrate array 110 itself is the same as the substrate 110 for the light-emitting device 1, and has multiple first conductors 121 and second conductors 122 disposed thereon in advance.

Figure 7A:
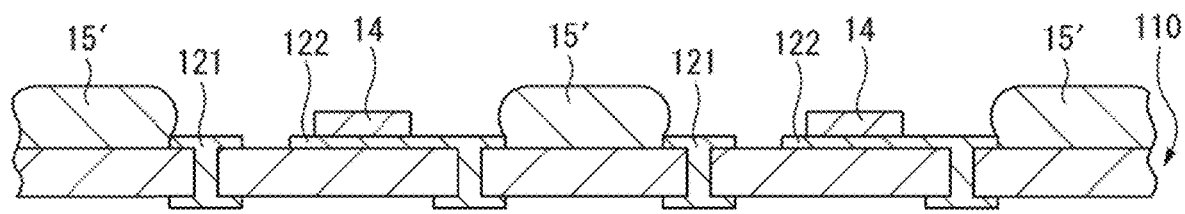
FIGS. 7(A) to (C) are schematic diagrams for explaining the steps of the method of manufacturing the light-emitting device 1'.
Figure 7B:
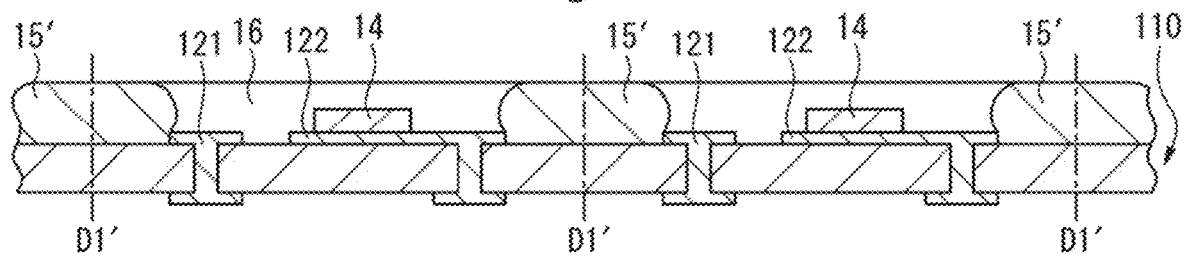
Figure 7C:
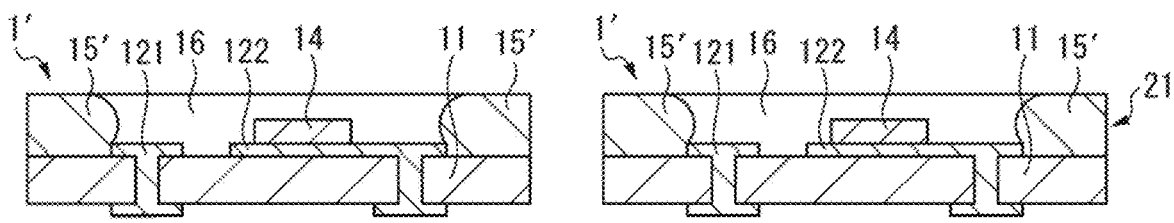

FIGS. 7(A) to (C) are schematic diagrams for explaining the steps of a method of manufacturing the light-emitting device 1'. Since the initial steps of the method of manufacturing the light-emitting device 1' are the same as those shown in FIGS. 5(A) and 5(B), description thereof is omitted.

In a dam member-disposing step, dam members 15' are disposed along arrows 201 and 202 in FIG. 6 on the upper surface of the substrate array 110, as shown in FIG. 7(A). The dam members 15' are drawn so as to be disposed between the conductive patterns, and thereby can be formed so as not to wind, being disposed so as to surround the respective LED elements 14.

Next, in a sealant-filling step, a sealant 16 is disposed in each of the regions surrounded by the respective dam members 15' to a height that the upper surface 141 of the LED element 14 is not exposed, as shown in FIG. 7(B). The disposed (or filled) sealant 16 is heated and cured.

Finally, in a dicing step, the substrate array 110 are cut near the centers of the respective dam members 15' (at positions of D1') into pieces, as shown in FIG. 7(C), and thereby light-emitting devices 1' are manufactured. This results in the outer side surfaces of each dam member' 15 being side surfaces 21 made by dicing. In the light-emitting device 1', the dam member 15' has a different width, and is formed so that the edges of the dam member 15' are on part of the first conductor 121 and the second conductor 122. As illustrated in FIG. 7(C), the dam member 15' of the light-emitting device 1', which is a modified example of the light-emitting device 1, is wide, and thus has edges on the first conductor 121 and the second conductor 122. The conductive pattern 12 and the electrodes 13 can be disposed with high position accuracy so that they are substantially aligned. The dam member 15, which is disposed with reference to the conductive pattern 12, can be cut with reference to the electrodes 13 at the center of the dam member 15 at the time of dicing.

Figure 8:
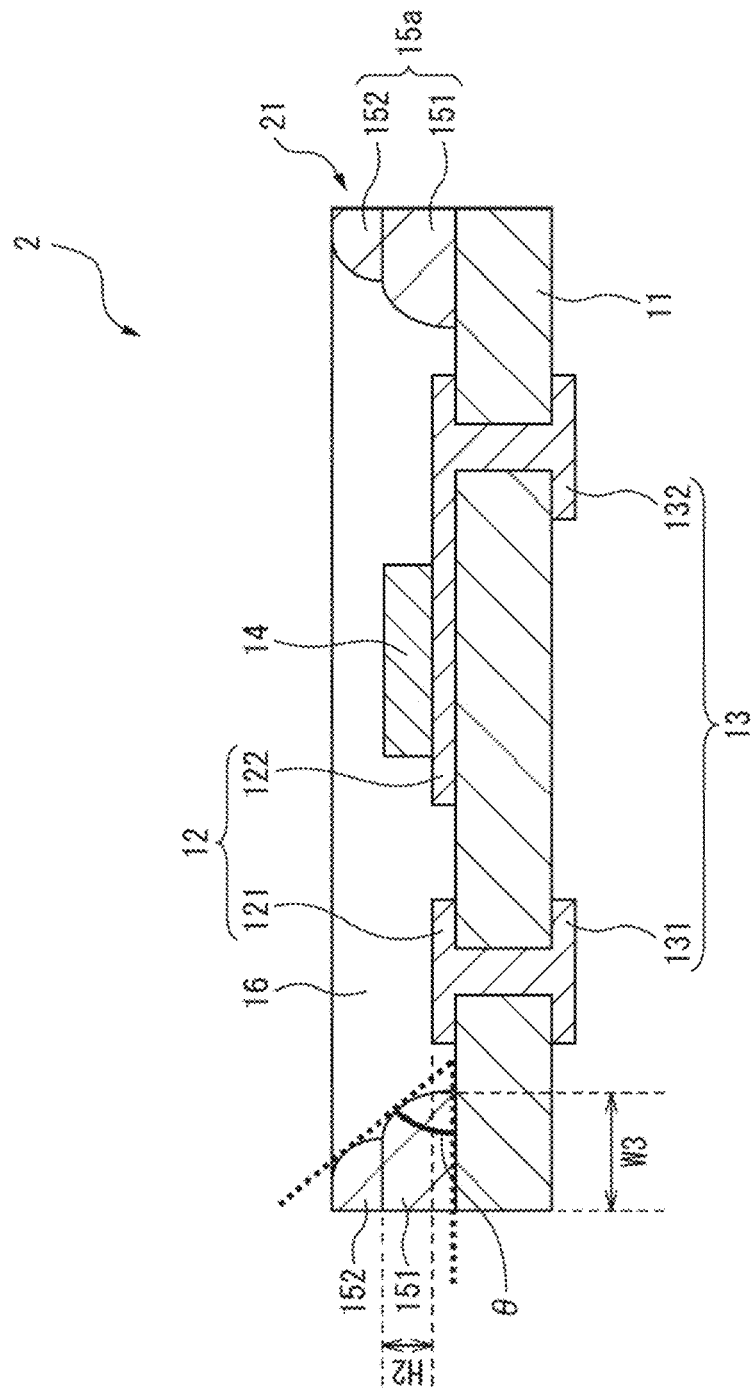
FIG. 8 is a cross-sectional view of a light-emitting device 2 according to a second embodiment.

FIG. 8 is a cross-sectional view of a light-emitting device 2 according to a second embodiment. In FIG. 8, components that are the same as those of the light-emitting device 1 shown in FIG. 1 to 3 are assigned the same reference numerals, and description thereof is omitted. The light-emitting device 2 differs from the light-emitting device 1 only in the shape of a dam member 15a.

The dam member 15a of the light-emitting device 2 contains a base resin and fine particles of titanium oxide, a first-particle-size filler 19, and a second-particle-size filler 20 that are similar to those of the dam member 15, but differs in that the dam member 15a is composed of a first frame part 151 and a second frame part 152. First, white resin drops that are the same as those in the case of the dam member 15 are applied to form a first frame part 151, and the first frame part 151 is processed so as to have an even upper part, and then heated and cured. Next, white resin drops are further applied to the evenly made upper surface of the first frame part 151, and the applied resin drops are heated and cured to form a second frame part 152. At this time, the inner circumferential surface of the second frame part 152 becomes a curved surface by surface tension of the resin drops. Since the upper surface of the first frame part 151, which is the first layer of the dam, is made even, resin drops are prevented from running down the side surface of the first frame part 151. In this way, the two-layer dam member 15a is disposed on the upper surface of the substrate 11. The dam member 15a can be simply made because it is not necessary to form any special connecting portion between the first frame part 151 and the second frame part 152.

While the second frame part 152 is being cured or after it is cured, the upper surface of the second frame part 152 may be pressed and thereby made even. When the upper surface of the second frame part 152 is made even, the height of the cut dam member 15 is not affected even if the cutting position at dicing is slightly off from the correct position, and thus light-emitting devices 2 of uniform quality are manufactured. The curved shapes of the inner circumferential surfaces of the first frame part 151 and the second frame part 152 can be adjusted by pressing. For example, a strong press can move the center of the curve toward the top of the dam rather than the substrate surface, which widens a portion of the dam member that is beside the LED element 14 and as high as the top of the LED element, preventing light from escaping sideways.

As described above, the height of the product can be adjusted by using the structure having layered frame parts as the dam member 15a. The bottom width of the second frame part 152 is the same as the width of the even portion of the upper surface of the first frame part 151. When the first frame part 151 has the same aspect ratio of bottom width to height as the second frame part 152, the height of the dam of the second frame part 152 can be controlled with the width of the even portion of the upper surface of the first frame part 151. The sum of the heights of the first frame part 151 and the second frame part 152 may be the same as the height of the dam member 15. The width of the first frame part 151 may be the same as the width of the dam member 15.

The inclination angle ($\theta$) between the substrate 11 and the tangent plane touching the inner curved surfaces of the first frame part 151 and the second frame part 152 is preferably between 65 degrees and 75 degrees inclusive, and more preferably between 70 degrees and 75 degrees inclusive. Setting the inclination angle ($\theta$) of the tangent plane between 65 degrees and 75 degrees inclusive causes most of light emitted horizontally from the LED element 14 to be reflected vertically upward by the dam member 15, improving the efficiency of light extraction of the light-emitting device 1 and preventing spread of light flux emitted from the light-emitting device 1 to the outside. Setting the inclination angle ($\theta$) of the tangent plane between 65 degrees and 75 degrees inclusive causes most of light emitted horizontally from the LED element 14 to be reflected vertically upward by the dam member 15, improving the efficiency of light extraction of the light-emitting device 2 and preventing spread of light flux emitted from the light-emitting device 1 to the outside, which improves optical properties of the light-emitting device 2.

Figure 9:
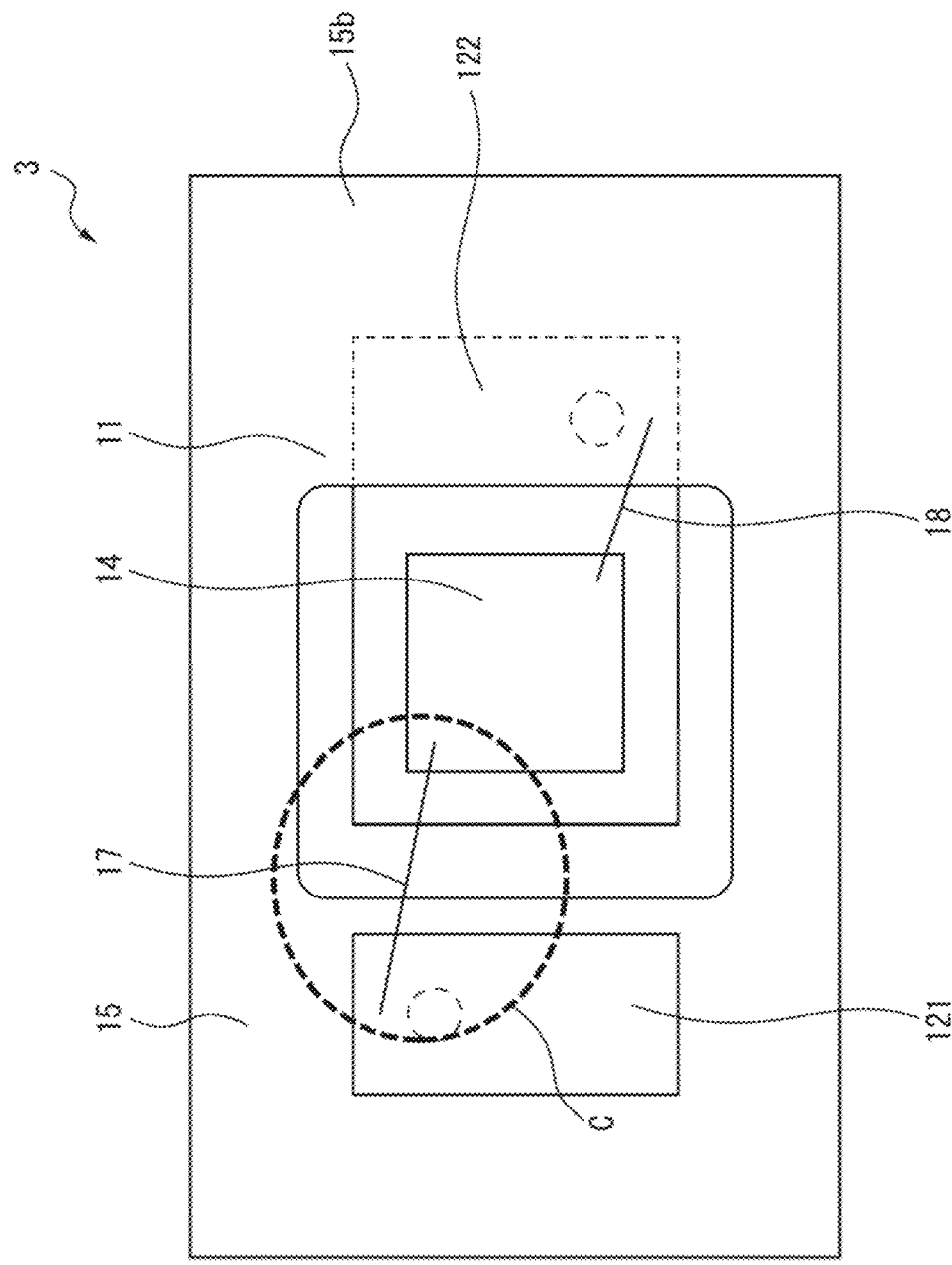
FIG. 9 is a plan view of a light-emitting device 3 according to a third embodiment.
Figure 10:
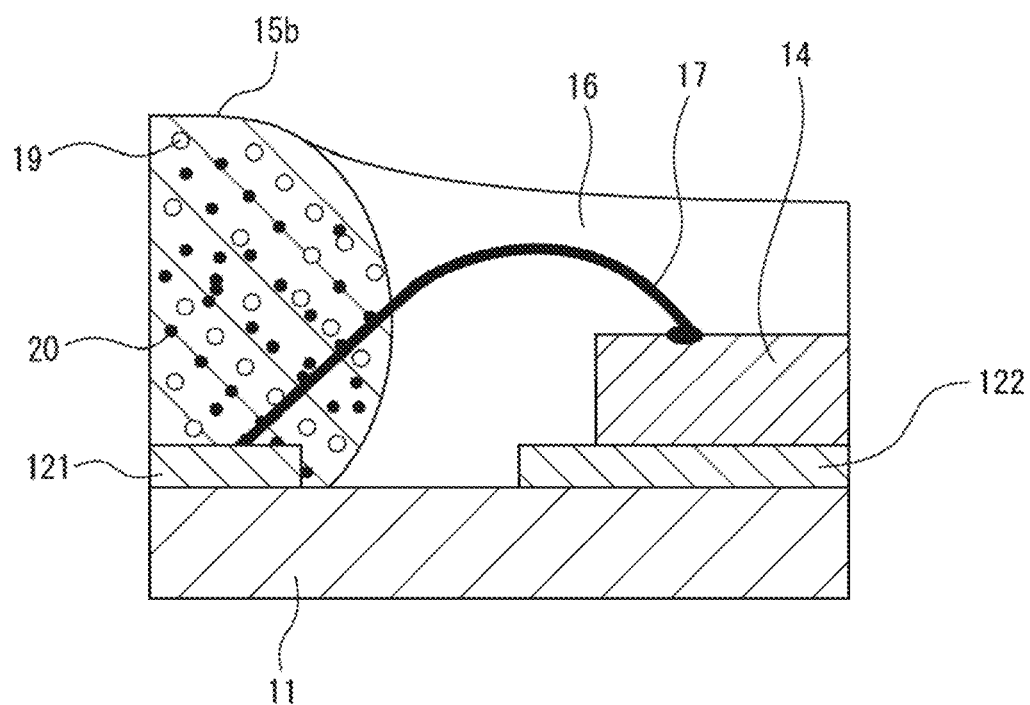
FIG. 10 is a cross-sectional view of C-portion in FIG. 9.

FIG. 9 is a plan view of a light-emitting device 3 according to a third embodiment. FIG. 10 is a cross-sectional view of C-portion in FIG. 9. In FIGS. 7 and 10, components that are the same as those of the light-emitting device 1 shown in FIG. 1 to 3 are assigned the same reference numerals, and description thereof is omitted. The light-emitting device 3 differs from the light-emitting device 1 only in that a dam member 15b of a different shape covers the bonding wire 17 and the first conductor 121. Components constituting the dam member 15b are the same as those of the dam member 15 of the light-emitting device 1.

In the light-emitting device 3, the dam member 15b is disposed close to the LED element 14 and has a convex shape on the inner side, as shown in FIG. 10, and thus part of the bonding wire 17 is covered with the dam member 15b. Since the dam member 15b is disposed after wire bonding, the dam member 15b can cover part of the bonding wire 17 or 18. This enables the light-emitting device 3 to have a smaller structure. In addition, the bonding wire 17 or 18 is covered with both the dam member 15b and the sealant 16, but a wire break caused by stress during curing can be prevented by the dam member 15b and the sealant 16 having the same hardness.

As described above, covering part of the bonding wire 17 or 18 with the dam member 15b enables the dam member 15b to be brought closer to the LED element 14, and thereby enables the light-emitting device 3 to be highly directional.

Figure 11:
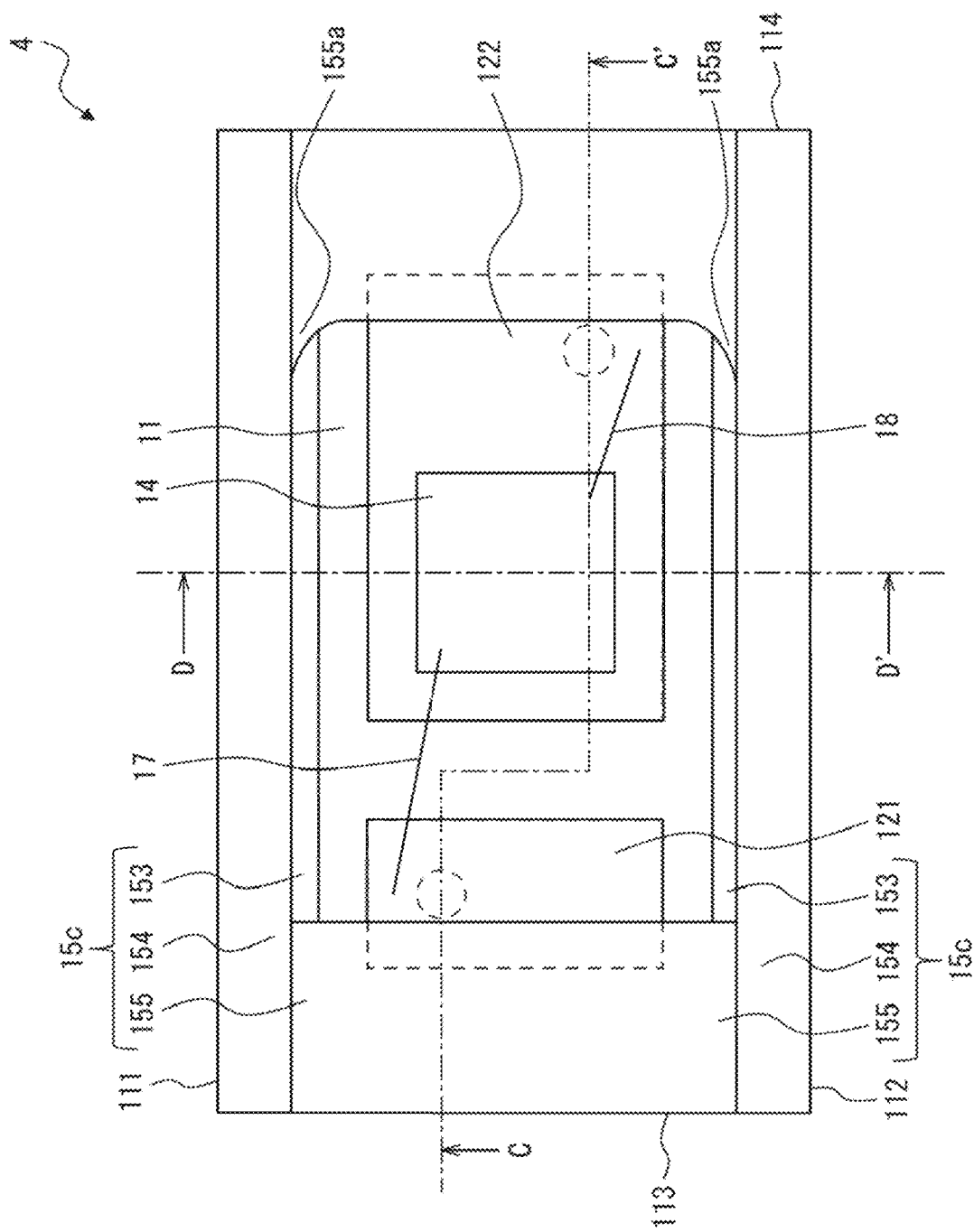
FIG. 11 is a plan view of a light-emitting device 4 according to a fourth embodiment.
Figure 12:
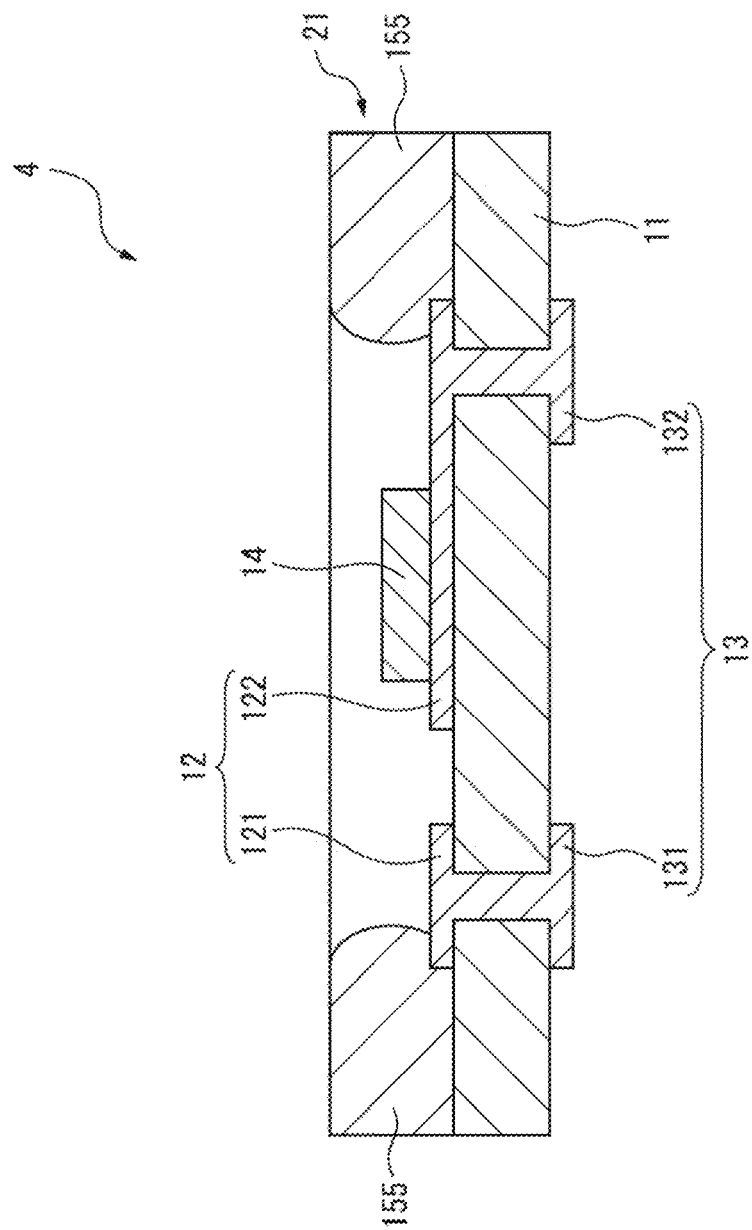
FIG. 12 shows a cross section taken along line C-C' in FIG. 11.
Figure 13:
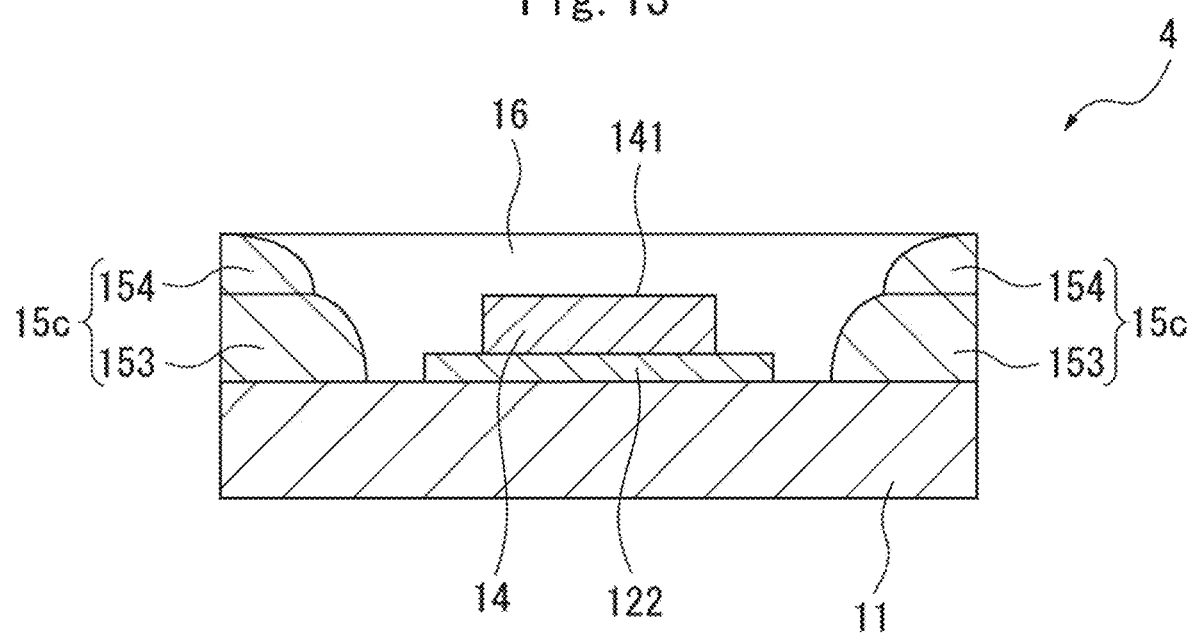
FIG. 13 shows a cross section taken along line D-D' in FIG. 11.

FIG. 11 is a plan view of a light-emitting device 4 according to a fourth embodiment. FIG. 12 shows a cross section taken along line C-C' in FIG. 11. FIG. 13 shows a cross section taken along line D-D' in FIG. 11. In FIGS. 11 to 13, components that are the same as those of the light-emitting device 1 shown in FIG. 1 to 3 are assigned the same reference numerals, and description thereof is omitted. The light-emitting device 4 differs from the light-emitting device 1 only in the shape of a dam member 15c.

The dam member 15c of the light-emitting device 4 contains a base resin and fine particles of titanium oxide, a first-particle-size filler 19, and a second-particle-size filler 20 that are similar to those of the dam member 15, but differs in that the dam member 15c is composed of a pair of first frame parts 153, a pair of second frame parts 154, and a pair of third frame parts 155. The pair of first frame parts 153 is disposed along the pair of long sides 111 and 112 of the substrate 11. The pair of second frame parts 154 is disposed on the upper surfaces of the pair of long sides 111 and 112. The pair of third frame parts 155 is disposed along the pair of short sides 113 and 114 of the substrate 11. Both ends of the pair of third frame parts 155 are disposed on the upper surfaces of both ends of the pair of first frame parts 153, and both ends of the pair of second frame parts 154 are disposed on the upper surfaces of both ends of the pair of third frame parts 155.

When the light-emitting device 4 is viewed from above, the third frame part 155 is wider than the first frame part 153. The width of third frame part 155 is preferably 150% to 200% of that of the first frame part 153. When the width of the third frame part 155 is less than 150% of that of the first frame part 153, it is difficult to increase the height of the third frame parts 155. When the width of the third frame part 155 is greater than 200% of that of the first frame part 153, the amount of application required to form the third frame parts 155 increases, which increases manufacturing cost.

First, white resin drops that are the same as those in the case of the dam member 15 are applied to form a pair of first frame parts 153 along the pair of long sides 111 and 112 of the substrate 11, and the first frame parts 153 are processed so as to have an even upper part, and then heated and cured. Next, white resin drops that are the same as those in the case of the dam member 15 are applied to form a pair of third frame parts 155 along the pair of short sides 113 and 114 of the substrate 11, and the third frame parts 155 are processed so as to have an even upper part, and then heated and cured. Next, white resin drops are further applied to the evenly made upper surfaces of the first frame parts 153, and second frame parts 154 are formed by being heated and cured after the second frame parts 154 and the third frame parts 155 are processed so as to have an even upper part. At this time, the inner and outer circumferential surfaces of the second frame parts 152 become a curved surface by surface tension of the resin drops. Since the upper surfaces of the first frame parts 153 and the third frame parts 155 are made even, resin drops are prevented from running down the side surfaces of the first frame parts 151. In addition, by being heated and cured after the second frame parts 154 and the third frame parts 155 are processed so as to have an even upper part, the height of the first frame parts 153 and the second frame parts 154 disposed along the pair of long sides 111 and 112 of the substrate 11 becomes equal to that of the third frame parts disposed along the pair of short sides 113 and 114 of the substrate 11.

One of the third frame parts 155 is disposed so as to cover an outer edge of the first conductor 121, and the other of the third frame parts 155 is disposed so as to cover an outer edge of the second conductor 122. The third frame parts 155 are preferably formed so as to cover a portion in the range of 100 μm on the outer edge of the first conductor 121 and the second conductor 122. The dam member 15c need not necessarily cover the outer edge of the first conductor 121 and the second conductor 122.

The light-emitting device 4, in which the dam member disposed along the pair of short sides 113 and 114 of the substrate 11 is composed only of the third frame parts 155, includes fewer layers of frame parts than the light-emitting device 2. In the light-emitting device 4, including fewer layers of frame parts than the light-emitting device 2 leads to fewer crossings of the frame parts, which inhibits an increase in the angle of the dam member caused by superposing frame parts. In the light-emitting device 4, inhibiting an increase in the angle of the dam member reduces interference between the frame parts, which reduces variations in manufacture caused by interference between the frame parts. Further, including fewer layers of frame parts than the light-emitting device 2 enables the light-emitting device 4 to be manufactured by a simplified process and at reduced cost.

In the light-emitting device emitting 4, including fewer layers of frame parts than the light-emitting device 2 inhibits a disposed frame part from losing its shape when another frame part is disposed later. In the light-emitting device 4, a pair of projections 155a projecting from the pair of third frame parts 155 is formed by application of the second frame parts 154. By reducing the speed of application of the second frame parts 154, the pair of projections 155a can be made small. The pair of projections 155a may be used for determination of polarity.

In the light-emitting device 4, since the third frame parts 155 disposed along the pair of short sides 113 and 114 of the substrate 11 are wide, the light-emitting surface is small. The light-emitting device 4, which has a small light-emitting surface, is preferably used as a light-emitting device for an application in which a small light-emitting area is desirable, such as a light source for backlight with a lens.

In the light-emitting device 4, since the pair of third frame parts 155 covers outer edges of the first conductor 121 and the second conductor 122, light to the outer edges of the first conductor 121 and the second conductor 122 is reflected by the pair of third frame parts 155, which is not affected by a sulfide gas. Decline in the efficiency of light extraction of the light-emitting device 4 caused by the effect of a sulfide gas can be reduced by light to the outer edges of the first conductor 121 and the second conductor 122 being reflected by the pair of third frame parts 155. Decline in the efficiency of light extraction can be reduced by the pair of third frame parts 155 covering a portion in the range of 100 μm on the outer edge of the first conductor 121 and the second conductor 122.

In the light-emitting device 4, the first frame parts 153 and the second frame parts 154 are disposed in two layers along the pair of long sides 111 and 112, and the one-layer third frame part 155 is disposed along the pair of short sides 113 and 114. However, in the light-emitting device according to the embodiment, it is only necessary that the number of layers of the frame parts disposed along the pair of short sides 113 and 114 be less than that of the frame parts disposed along the pair of long sides 111 and 112.

In the light-emitting device 4, the first frame parts 153 and the second frame parts 154 are disposed in two layers along the pair of long sides 111 and 112, and the one-layer third frame part 155 is disposed along the pair of short sides 113 and 114. However, the first to third frame parts 153 to 155 may be disposed differently. In the light-emitting device according to the embodiment, a pair of first frame parts is disposed, on a substrate having a rectangular shape with two pairs of sides, along one of the two pairs of sides, and a pair of second frame parts is disposed on the upper surfaces of the pair of first frame parts. A pair of third frame parts is disposed along the other of the two pairs of sides. For example, when the light-emitting element has a rectangular shape with a pair of long sides and a pair of short sides, the pair of first frame parts and the pair of second frame parts are disposed so as to face the pair of long sides of the light-emitting element, and the pair of third frame parts is disposed so as to face the pair of short sides of the light-emitting element.

Figure 14:
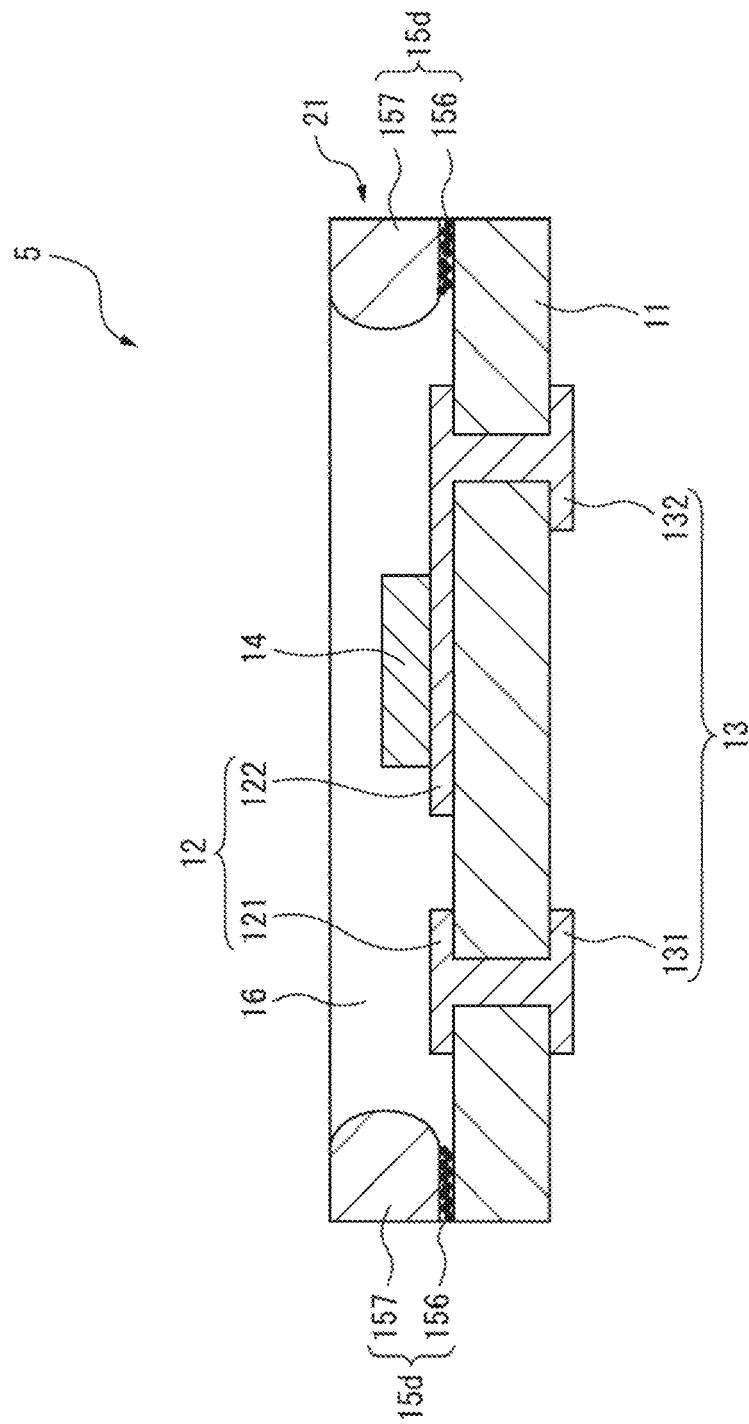
FIG. 14 is a cross-sectional view of a light-emitting device 5 according to a fifth embodiment.

FIG. 14 is a cross-sectional view of a light-emitting device 5 according to a fifth embodiment. In FIG. 14, components that are the same as those of the light-emitting device 1 shown in FIG. 1 to 3 are assigned the same reference numerals, and description thereof is omitted. The light-emitting device 5 differs from the light-emitting device 1 only in the shape of a dam member 15d.

The dam member 15d of the light-emitting device 5 includes a phosphor layer 156 and a frame part 157. The phosphor layer 156 is formed of a phosphor that is disposed on the upper surface of the substrate 11, and that converts the wavelength of light emitted from the LED element 14. The phosphor constituting the phosphor layer 156 is preferably a red phosphor, such as a particulate phosphor material of $CaAlSiN_3:Eu2^{2+}$ and KSF. The phosphor included in the first frame part 156 may be a green phosphor, such as a particulate phosphor material of $(BaSr)_2SiO_4:Eu^{2+}$. The phosphor layer 156 is formed by applying a phosphor to a region where the dam member 15d is disposed with a device such as a spray.

The frame part 157 includes a base resin, a first-particle-size filler 19, and a second-particle-size filler 20, but does not include a reflective material, such as fine particles of titanium oxide. Since no reflective material is included, the frame part 157 is a transparent member that transmits light emitted from the LED element 14 and light radiated from the phosphor, and is thus optically transparent. The frame part 157 may include a reflective material.

By the phosphor constituting the phosphor layer 156 being disposed on the upper surface of the substrate 11, the light-emitting device 5 can convert blue light of a short wavelength incident on the first frame part 156 into red or green light of a long wavelength to irradiate the surface of the substrate 11. By converting light of a short wavelength emitted from the LED element 14 into light of a long wavelength to irradiate the surface of the substrate 11, the light-emitting device 5 can inhibit the surface of the substrate 11 from being deteriorated by incidence of light emitted from the LED element 14. In the light-emitting device 5, since deterioration of the surface of the substrate 11 can be inhibited, the risk of peeling of the dam member 15d off the substrate 11 caused by deterioration of the surface of the substrate 11 is low, which leads to high reliability.

Figure 15:
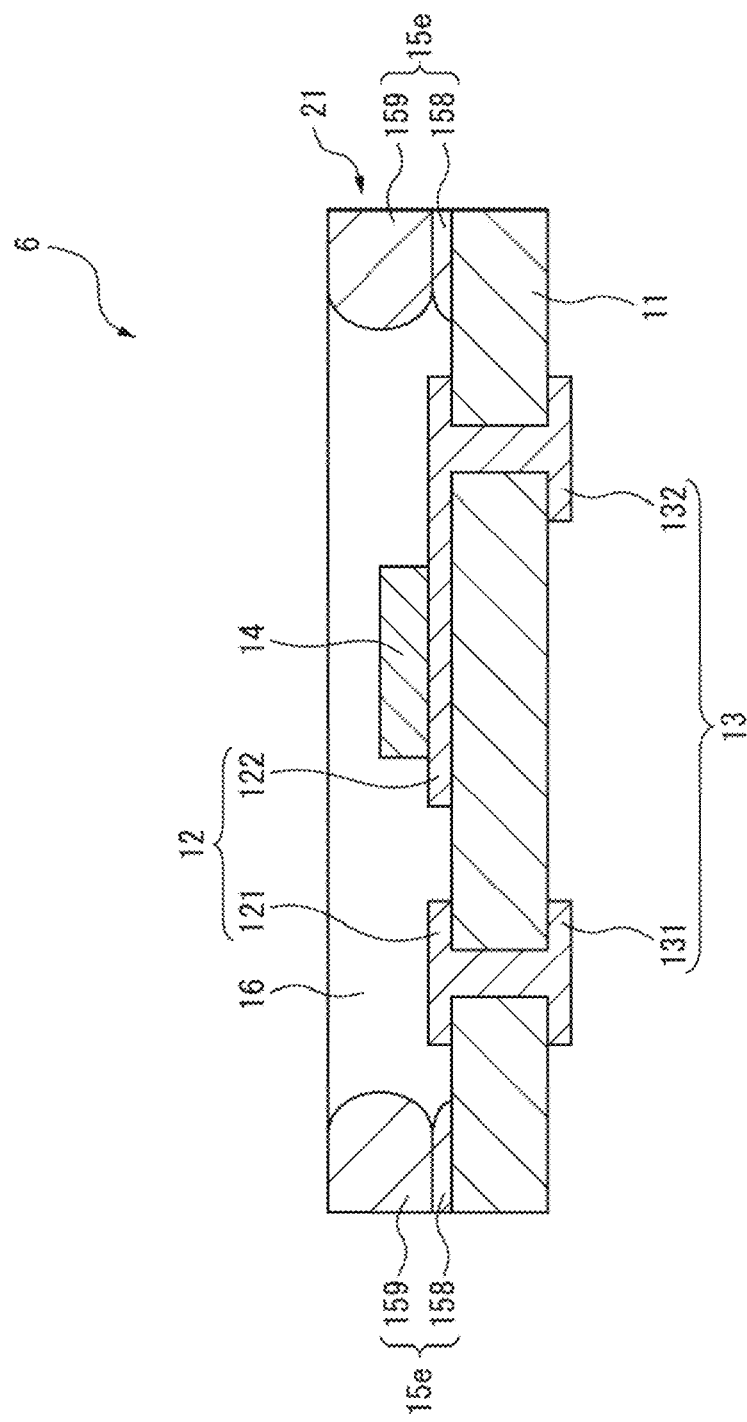
FIG. 15 is a cross-sectional view of a light-emitting device 6 according to a sixth embodiment.

FIG. 15 is a cross-sectional view of a light-emitting device 6 according to a sixth embodiment. In FIG. 15, components that are the same as those of the light-emitting device 1 shown in FIG. 1 to 3 are assigned the same reference numerals, and description thereof is omitted. The light-emitting device 6 differs from the light-emitting device 1 only in the shape of a dam member 15e.

The dam member 15e of the light-emitting device 6 includes a first frame part 158 and a second frame part 159. The first frame part 158 includes, in addition to a base resin, a phosphor that is disposed on the upper surface of the substrate 11, and that converts the wavelength of light emitted from the LED element 14. The phosphor included in the first frame part 158 is preferably a red phosphor, such as a particulate phosphor material of $CaAlSiN_3:Eu^{2+}$ and KSF. The phosphor included in the first frame part 158 may be a green phosphor, such as a particulate phosphor material of $(BaSr)_2SiO_4:Eu^{2+}$. The first frame part 158 may include a reflective material.

The second frame part 159 includes a base resin, a first-particle-size filler 19, and a second-particle-size filler 20, but does not include a reflective material, such as fine particles of titanium oxide. Since no reflective material is included, the second frame part 159 is a transparent member that transmits light emitted from the LED element 14 and light radiated from the phosphor, and is thus optically transparent. The second frame part 159 may include a reflective material.

The dam member 15e is formed by applying raw materials of the first frame part 158 and the second frame part 159 with a dispenser. The dam member 15e may be formed by disposing a phosphor sheet corresponding to the first frame part 158 and then applying a raw material of the second frame part 159 including a base resin, a first-particle-size filler 19, and a second-particle-size filler 20 with a dispenser. Alternatively, the dam member 15e may be formed by disposing a phosphor sheet corresponding to the first frame part 158 and then disposing a resin sheet corresponding to the second frame part 159 including a base resin, a first-particle-size filler 19, and a second-particle-size filler 20 on the phosphor sheet.

By the first frame part 158 being disposed on the upper surface of the substrate 11, the light-emitting device 6 can convert blue light of a short wavelength incident on the first frame part 158 into red or green light of a long wavelength to irradiate the surface of the substrate 11, similarly to the light-emitting device 5. By converting light of a short wavelength emitted from the LED element 14 into light of a long wavelength to irradiate the surface of the substrate 11, the light-emitting device 6 can inhibit the surface of the substrate 11 from being deteriorated by incidence of light emitted from the LED element 14. In the light-emitting device 6, since deterioration of the surface of the substrate 11 can be inhibited, the risk of peeling of the dam member 15e off the substrate 11 caused by deterioration of the surface of the substrate 11 is low, which leads to high reliability.

The light-emitting device 6 includes the dam member 15e including the first frame part 158 and the second frame part 159. However, the light-emitting device according to the embodiment may include a dam member 15 and a phosphor layer that is disposed between the dam member 15 and the substrate 10 on the upper surface of the substrate 10, and that contains a phosphor converting the wavelength of light emitted from the light-emitting element 14, instead of the dam member 15e.

Figure 16:
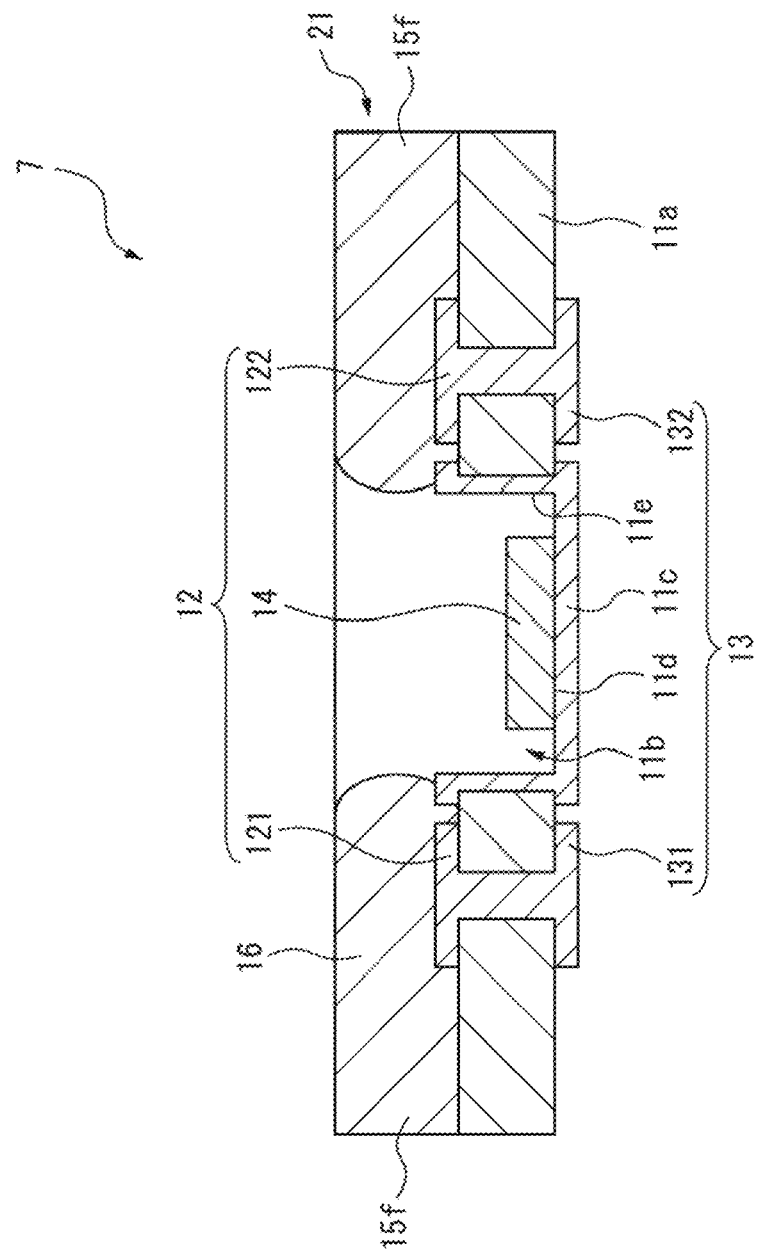
FIG. 16 is a cross-sectional view of a light-emitting device 7 according to a seventh embodiment.

FIG. 16 is a cross-sectional view of a light-emitting device 7 according to a seventh embodiment. In FIG. 16, components that are the same as those of the light-emitting device 1 shown in FIG. 1 to 3 are assigned the same reference numerals, and description thereof is omitted. The light-emitting device 7 differs from the light-emitting device 1 only in the structure of a substrate 11a and the shape of a dam member 15f.

The substrate 11a is, for example, a glass epoxy substrate, and has a pad 11c, which forms a recess 11b housing the LED element 14, disposed at a center portion. The recess 11b, also referred to as a cavity, has a recess bottom surface 11d on which the LED element 14 is disposed, and a recess side surface 11e disposed so as to surround the bottom surface. On the back surface of the recess bottom surface 11dc, a heat sink can be disposed.

The dam member 15f of the light-emitting device 7 contains a base resin and fine particles of titanium oxide, a first-particle-size filler 19, and a second-particle-size filler 20 that are similar to those of the dam member 15, but differs in that the dam member 15*f* covers the whole surfaces of the first conductor 121 and the second conductor 122 and has edges disposed near the recess 11*b*. When the light-emitting device 7 is viewed from above, the dam member 15*f* is disposed so as to surround the recess 11*b*.

In the light-emitting device 7, since the LED element 14 is disposed on the recess bottom surface 11*d* on whose back surface a heat sink can be disposed, the heat-sinking efficiency can be increased, which enables a large current to flow through the LED element 14 to increase luminance.

Since the light-emitting surface is made small by disposing the dam member 15*f* so as to surround the recess 11*b*, the light-emitting device 7 can be used as a light-emitting device for an application in which a small light-emitting area is desirable, such as a light source for backlight with a lens.

The light-emitting device 7, which includes the glass epoxy substrate 11*a*, can be designed with a higher degree of freedom than a light-emitting device including a metal substrate, such as an aluminum substrate.

The light-emitting device according to the embodiment may include an LED element that emits infrared (IR) light, instead of the LED element 14. The light-emitting device 6 includes a single LED element 14 that emits blue light, but the light-emitting device according to the embodiment may include LED elements that emit red light, green light, and blue light, respectively, instead of the LED element 14.

When the light-emitting device according to the embodiment includes three LED elements that emit red light, green light, and blue light, respectively, three Zener diodes may be disposed next to the three LED elements. In the light-emitting device according to the embodiment, the three Zener diodes disposed next to the three LED elements can function as light-absorbing members that absorb light emitted from the LED elements. By the three Zener diodes functioning as light-absorbing members, the light-emitting device according to the embodiment can adjust the luminous intensities of red light, green light, and blue light emitted from the three LED elements to emit light of a desired color temperature.

Figure 17:
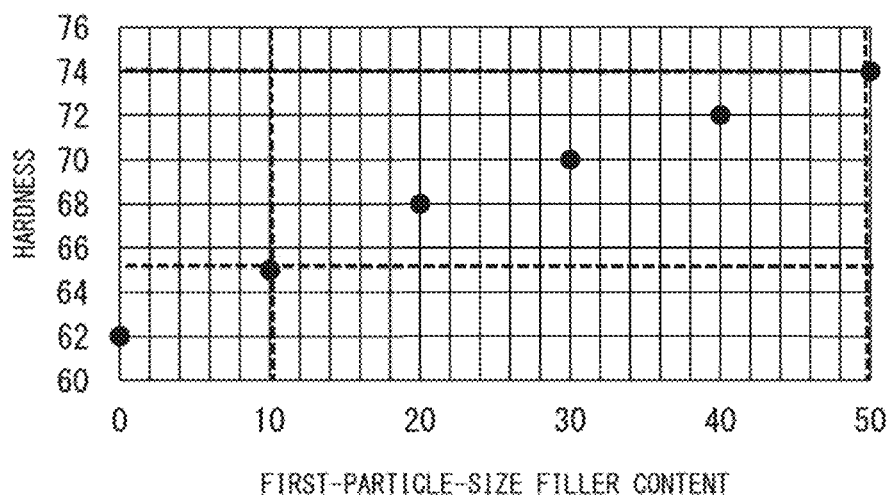
FIG. 17 is a graph for explaining the relationship between first-particle-size filler content and hardness.

FIG. 17 shows the relationship between the content of the first-particle-size filler 19 in the dam member 15 and the hardness of the dam member 15. The content is the weight ratio (wt %) of the first-particle-size filler 19 to the base resin in the cured dam member 15 of the finished light-emitting device 1. The hardness is a Shore D hardness. FIG. 17 shows the result obtained by measuring the Shore D hardness of the dam member 15 while varying the content of the first-particle-size filler 19 included in the dam member 15.

Figure 18:
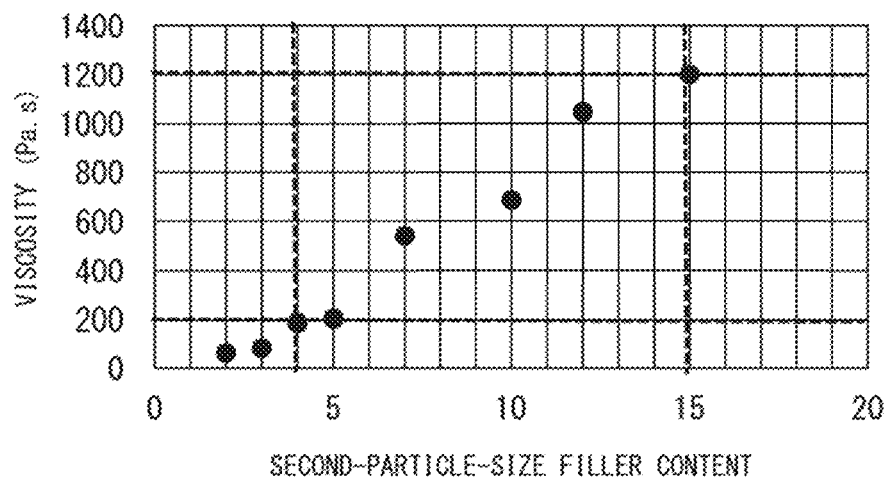
FIG. 18 is a graph for explaining the relationship between second-particle-size filler content and viscosity.

As shown in FIG. 18, the hardness of the cured dam member 15 is increased by containing the first-particle-size filler 19 in the dam member. In general, when the Shore D hardness is 65 or greater, no conspicuous burrs or chips appear on the exterior at cutting, e.g., dicing, and light-emitting devices having a favorable outward appearance can be manufactured. The viscosity of the dam member 15 may be reduced by containing the first-particle-size filler 19, and when the Shore D hardness is greater than 74, it is difficult to keep the dam member having a predetermined shape because of the bearing effect of the particles. In view of the above, the preferable range of the weight ratio (wt %) of the first-particle-size filler 19 to the base resin in the cured dam member 15 of the finished light-emitting device 1 is 10 to 50 wt %. When the Shore D hardness exceeds 74 by increasing the content of the first-particle-size filler 19, a nozzle for application will be clogged, making it difficult to apply a resin for forming the dam member.

FIG. 18 shows the relationship between the content of the second-particle-size filler 20 in the dam member 15 and viscosity. The content is the weight ratio (wt %) of the second-particle-size filler 20 to the base resin in the cured dam member 15 of the finished light-emitting device 1. The viscosity is the viscosity (PaS) of uncured white resin drops. FIG. 18 shows the result obtained by measuring the viscosity of uncured white resin drops made for the dam member 15 while varying the content of the second-particle-size filler 20 included in the resin drops.

As shown in FIG. 18, the viscosity is increased by containing the second-particle-size filler 20 in the uncured white resin drops. In general, a viscosity of 200 (PaS) or greater results in viscosity during manufacture being high, enables keeping space between the particles at high viscosity, and enables keeping a tall and narrow shape. When the viscosity exceeds 1200 (PaS), the viscosity is so high that a nozzle for application will be clogged, making it difficult to apply a resin for forming the dam member. In view of the above, the preferable range of the weight ratio (wt %) of the second-particle-size filler 20 to the base resin in the cured dam member 15 of the finished light-emitting device 1 is 4 to 15 wt %. The weight ratios (wt %) of the second-particle-size filler 20 in FIG. 80 are calculated in consideration of the fact that the dam member 15 becomes 0 to 10% lighter when being cured.

When the viscosity of uncured white resin drops for forming the dam member 15 is low, the aspect ratio of bottom width to height of the dam member 15 cannot be kept high, resulting in the dam having a drooping shape. Thus the dam member 15 touches the LED element 14 to cause decline in the luminous efficiency, making it difficult to produce a small light-emitting device.

The shape of the dam member 15 is an important factor in preventing decline in the luminous efficiency of the light-emitting device 1, and the ratio of the bottom width of the dam member 15 (W1: the width from a position on the dam member 15 as high as the upper surface of the first conductor 121 to the side surface 21) to the height of the dam member 15 from the first conductor 121 (H1) is preferably 0.6 to 4.0 (see FIG. 3). When the ratio of the bottom width (W1) to the height (H1) of the dam member 15 is 0.6 to 4.0, decline in the luminous efficiency of the light-emitting device 1 can be prevented and the dam member 15 is not narrow to prevent light from escaping.

When the ratio of the bottom width (W1) to the height (H1) of the dam member 15 from the first conductor 121 is 0.6 to 4.0, the side surface of the dam member facing the LED element 14 is a convexity curved out toward the LED element 14 (see FIG. 3). In this case, the dam member 15 has a shape inclined inward, and the inclined surface has a convexity facing the element. The innermost point (P) of the convexity of the dam member 15 is within the range of the height of the light-emitting element, and the shape projecting inward causes light reflected by an area above the innermost point to be directed upward, improving the efficiency of light extraction. Further, the dam member 15 is disposed on the substrate including a conductive pattern, and as shown in FIG. 3, the dam member 15 has a cross-sectional shape in which the bottom width (W1) of the dam member 15 is less than the width of a portion of the dam member 15 projecting toward the element most (W2) (see FIG. 3). Since the dam member 15 has a small bottom width (W1) but is long between the side surfaces, the dam member can reflect light multiple times, which improves the color mixing property. Since narrowing a portion of the dam member 15 beside the LED element 14 causes light to escape, the efficiency of light extraction of the light-emitting device 1 is improved by including the innermost point (P) of the convexity of the dam member 15, i.e., the portion having the maximum width, within the range of the height of the light-emitting element.

The ratio of the bottom width of the first frame part 151 of the light-emitting device 2 (W3: the width from a position on the dam member 15a as high as the upper surface of the first conductor 121 to the side surface 21) to the height of the first frame part 151 from the first conductor 121 (H2) (see FIG. 8) is preferably 1.2 to 2.0. In this case, the shape is suitable for forming the second frame part 152.

As described above, the dam member 15 includes titanium oxide, and the weight ratio (wt %) of titanium oxide to the base resin is preferably in the of range of 10 to 70 wt %. In this case, light is efficiently reflected. As described above, the ratio of the bottom width (W1) to the height (H1) of the dam member 15 is preferably 0.6 to 4.0. However, in this case, the dam member 15 may be narrow, and the weight ratio of titanium oxide needs to be higher than usual. When the weight ratio (wt %) of titanium oxide to the base resin in the dam member 15 is 10 to 70 wt %, light from the LED element 14 can be efficiently reflected without escaping even if the width of the dam member 15 is, for example, 0.1 mm or less.

As described above, the dam member 15 need not necessarily contain titanium oxide. In other words, the dam member 15 may be transparent. A transparent dam member 15 enables light to be less directional. Alternatively, the dam member 15 may be black or blue. A black dam member 15 prevents the occurrence of a yellow ring. The dam member 15 may further include a phosphor. By including a phosphor in the dam member 15, the color temperature and the directivity of chromaticity can be adjusted. In the dam member 15a, only one of the first frame part 151 and the second frame part 152 may be transparent, black, or blue, or include a phosphor.

Each side of the light-emitting device 2 may be configured to have only the first frame part 151, a structure including the first frame part 151 and the second frame part 152 layered thereon, or a combination thereof. After two layers of frame parts are disposed on the long sides of the light-emitting device 2, a one-layer frame part may be disposed on the short sides thereof. When the pitch of the centers of the long-side frame parts is 1.5 mm or less, a dam member disposed on a two-layer dam enters between the two layers of the dam. Thus the dams on the short sides, even if they have one layer, can be made as tall as the two-layer dam, which enables reducing man-hours. By arranging the dams on the short sides side by side rather than layering them vertically, a portion connecting the wire and the conductor can be protected, and the device can be made highly directional on the long sides.

When the light-emitting device 1 is viewed from above, the dam member 15 may have four round corners with different radii. For example, when the radii of adjacent two corners are greater than those of the other two corners, the corners can also be used as a mark for recognizing the orientation. In the light-emitting device 2, the corners with greater radii of the first frame part 151 may differ from those of the second frame part 152. This makes the recognition mark easy to see.

In the light-emitting device 2, the phosphor contained in the sealant 16 can be settled on an area of the upper part of the first frame part 151 that borders the second frame part 152. When the phosphor is settled, the side surfaces of the LED element 14 may be exposed from the layer of the settled phosphor in some cases. This causes blue light to be intensely emitted sideways, but the blue light emitted sideways can be reduced by supplying yellow, using the phosphor on the border between the first frame part 151 and the second frame part 152.

Note that those skilled in the art can make various changes, substitutions, and modifications without departing from the scope of the present invention. For example, the above embodiments and modified examples may be appropriately combined and implemented in the scope of the present invention.

The invention claimed is:

1. A light-emitting device comprising:
a substrate;
an LED element mounted on the substrate;
a dam member disposed around the LED element; and
a sealant disposed inside the dam member and sealing the LED element, wherein
the dam member includes a base resin, a first-particle-size filler, and a second-particle-size filler,
the dam member contains 10 to 50 wt % of the first-particle-size filler with respect to the base resin,
the first-particle-size filler has an average particle size of 1 to 100 μm,
the dam member contains 4 to 15 wt % of the second-particle-size filler with respect to the base resin,
the second-particle-size filler has an average particle size of 1 to 500 nm, and
the dam member has a side surface made by dicing.

2. The light-emitting device according to claim 1, wherein the ratio of bottom width to height of the dam member is 0.6 to 4.0.

3. The light-emitting device according to claim 1, wherein a surface of the dam member facing the LED element is a convexity curved out toward the LED element.

4. The light-emitting device according to claim 1, wherein the dam member has a Shore D hardness of 65 to 74.

5. The light-emitting device according to claim 1, wherein the dam member further includes titanium oxide, and
the dam member contains 10 to 70 wt % of the titanium oxide with respect to the base resin.

6. The light-emitting device according to claim 1, wherein the dam member further includes a first frame part and a second frame part disposed on the upper surface of the first frame part, and
the first frame part has the same ratio between bottom width and height as the second frame part.

7. The light-emitting device according to claim 1, further comprising a wire for supplying electric power to the LED element, wherein
part of the wire is covered with the dam member.

8. The light-emitting device according to claim 1, wherein the dam member is optically transparent.

9. The light-emitting device according to claim 1, further comprising a conductive pattern that has electrical conductivity and that is disposed on the upper surface of the substrate so as to be surrounded by the dam member, wherein
the LED element is disposed on the upper surface of the conductive pattern, and
the dam member covers an outer edge of the conductive pattern.

10. The light-emitting device according to claim 1, further comprising a phosphor layer that is disposed between the dam member and the substrate on the upper surface of the substrate, and that contains a phosphor converting the wavelength of light emitted from the LED element.

11. The light-emitting device according to claim 1, wherein the substrate has a recess having a bottom surface and a side surface disposed so as to surround the bottom surface, and
 the LED element is disposed on the bottom surface of the recess, and the dam member is disposed so as to surround the recess.

12. The light-emitting device according to claim 1, wherein the substrate has a rectangular shape with two pairs of sides, and
 the dam member includes:
 a pair of first frame parts disposed along one of the two pairs of sides;
 a pair of second frame parts disposed on the upper surfaces of the pair of first frame parts; and
 a pair of third frame parts disposed along the other of the two pairs of sides.

13. The light-emitting device according to claim 12, wherein the substrate has a rectangular shape with a pair of long sides and a pair of short sides shorter than the pair of long sides,
 the pair of first frame parts and the pair of second frame parts are disposed along the pair of long sides, and
 the pair of third frame parts is disposed along the pair of short sides.

14. The light-emitting device according to claim 1, wherein the dam member further includes a phosphor disposed on the upper surface of the substrate and converting the wavelength of light emitted from the LED element.

15. The light-emitting device according to claim 14, wherein the dam member further includes a first frame part disposed on the substrate and including the phosphor, and a second frame part disposed on the upper surface of the first frame part and including the first-particle-size filler and the second-particle-size filler.

16. A method of manufacturing a light-emitting device, comprising the steps of:
 mounting an LED element on a surface of a substrate array;
 disposing a dam member around the LED element with a dispenser;
 disposing a sealant sealing the LED element inside the dam member; and
 dicing a cured dam member, wherein
 the dam member includes a base resin, a first-particle-size filler, and a second-particle-size filler,
 the dam member contains 10 to 50 wt % of the first-particle-size filler with respect to the base resin,
 the first-particle-size filler has an average particle size of 1 to 100 µm,
 the dam member contains 4 to 15 wt % of the second-particle-size filler with respect to the base resin, and
 the second-particle-size filler has an average particle size of 1 to 500 nm.

17. The method of manufacturing a light-emitting device according to claim 16, wherein in the step of cutting the dam member, the substrate array is diced from a surface on which the LED element is not mounted.

18. The method of manufacturing a light-emitting device according to claim 16, wherein the light-emitting device further includes a wire for supplying electric power to the LED element, and
 in the step of forming a dam member, a dam member is formed so as to cover part of the wire.

* * * * *